United States Patent
Itoh

(10) Patent No.: US 7,911,864 B2
(45) Date of Patent: Mar. 22, 2011

(54) SEMICONDUCTOR MEMORY DEVICE

(75) Inventor: Mikihiko Itoh, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 12/270,267

(22) Filed: Nov. 13, 2008

(65) Prior Publication Data
US 2009/0129154 A1 May 21, 2009

(30) Foreign Application Priority Data

Nov. 15, 2007 (JP) ................ 2007-297024

(51) Int. Cl.
*G11C 7/04* (2006.01)
(52) U.S. Cl. .................... 365/211; 365/185.17
(58) Field of Classification Search .............. 365/211, 365/185.17
See application file for complete search history.

(56) References Cited

U.S. PATENT DOCUMENTS

| | | | |
|---|---|---|---|
| 6,643,193 B2 * | 11/2003 | Yamaki et al. | 365/189.09 |
| 7,009,881 B2 * | 3/2006 | Noguchi | 365/185.17 |
| 7,411,830 B2 * | 8/2008 | Takeuchi et al. | 365/185.18 |
| 7,729,165 B2 * | 6/2010 | Wang | 365/185.03 |
| 2007/0036016 A1 | 2/2007 | Takeuchi et al. | |

FOREIGN PATENT DOCUMENTS

| | | |
|---|---|---|
| JP | 2006-196078 | 7/2006 |
| KR | 10-2007-0079111 | 8/2007 |
| KR | 10-2007-0080037 | 8/2007 |

* cited by examiner

*Primary Examiner* — Tuan T. Nguyen
(74) *Attorney, Agent, or Firm* — Oblon, Spivak, McClelland, Maier & Neustadt, L.L.P.

(57) ABSTRACT

A semiconductor memory device includes a memory cell array in which a plurality of memory cells are arranged in a matrix, a read unit which reads out data from the memory cells in the memory cell array, a write unit which writes data in the memory cells in the memory cell array, a read voltage generating unit which generates a read voltage and supplies the read voltage to the read unit, and a voltage control unit which controls the read voltage in accordance with temperatures.

17 Claims, 16 Drawing Sheets

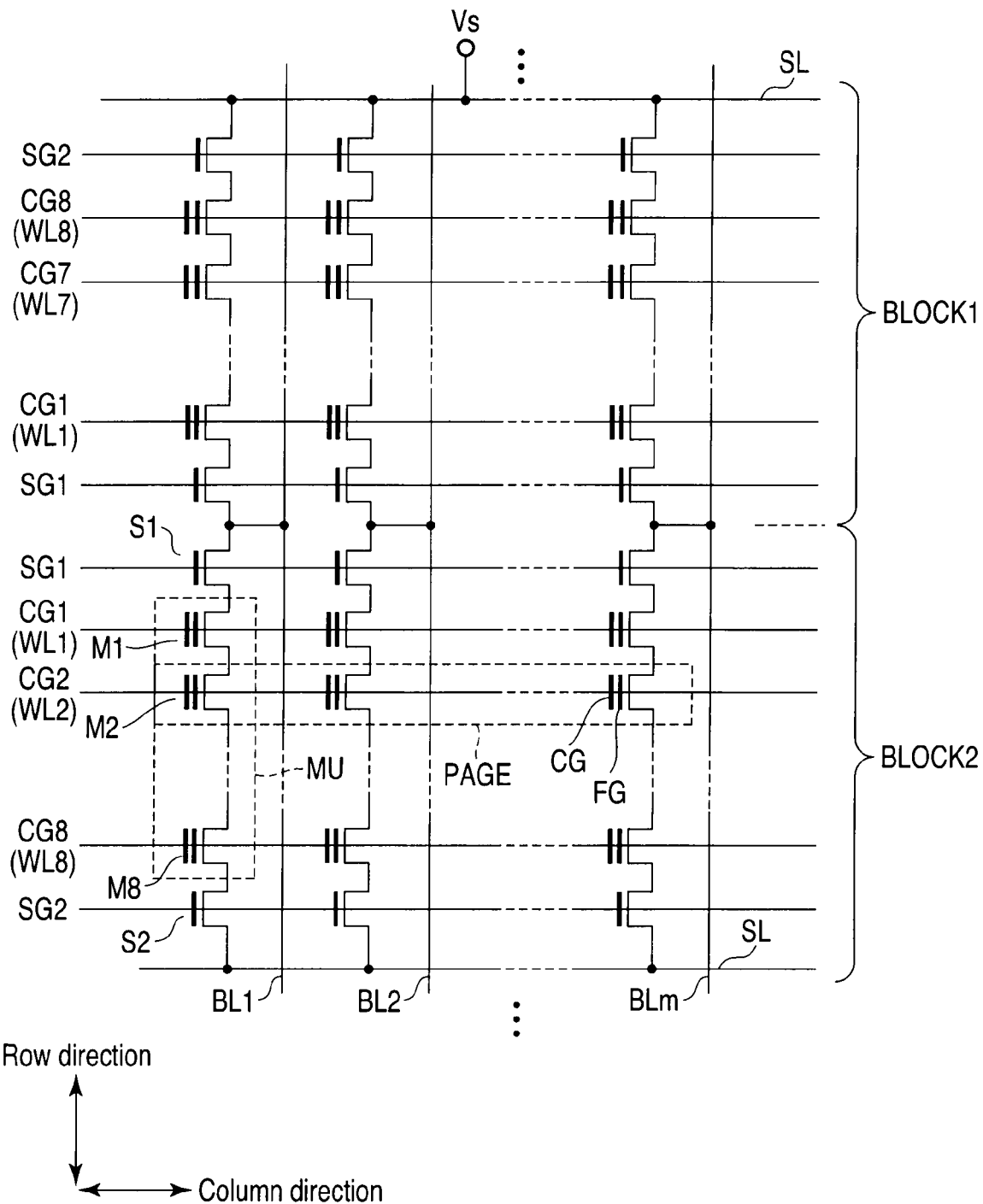
F I G. 2

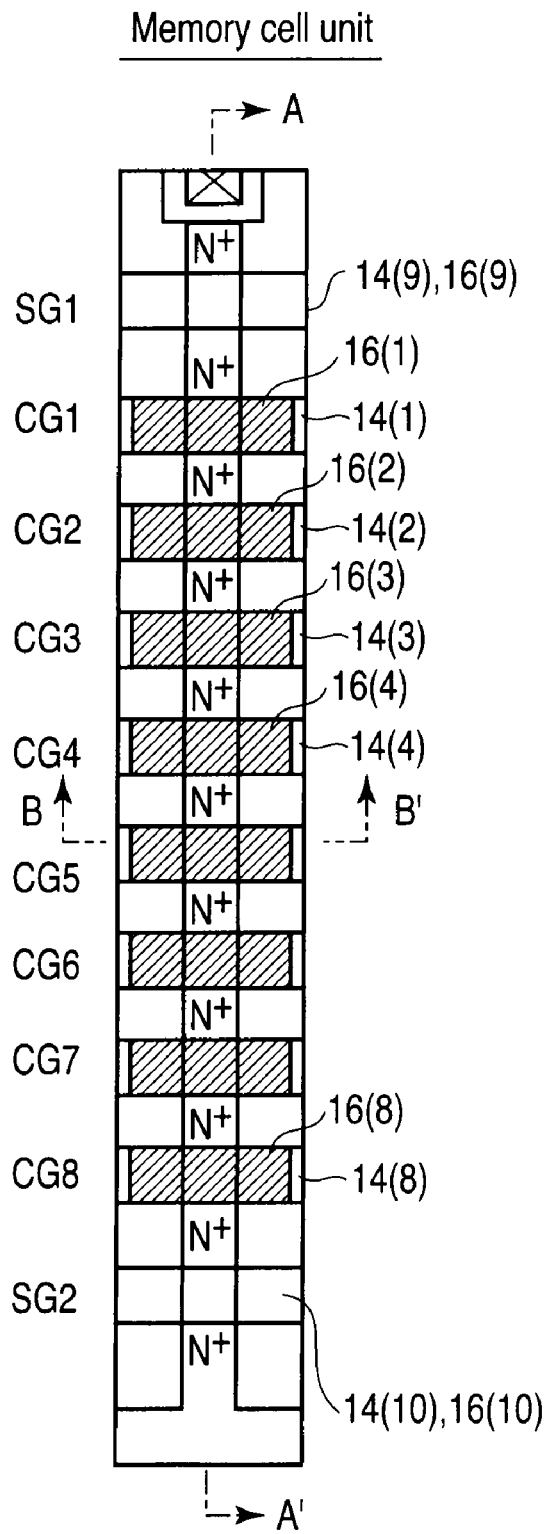
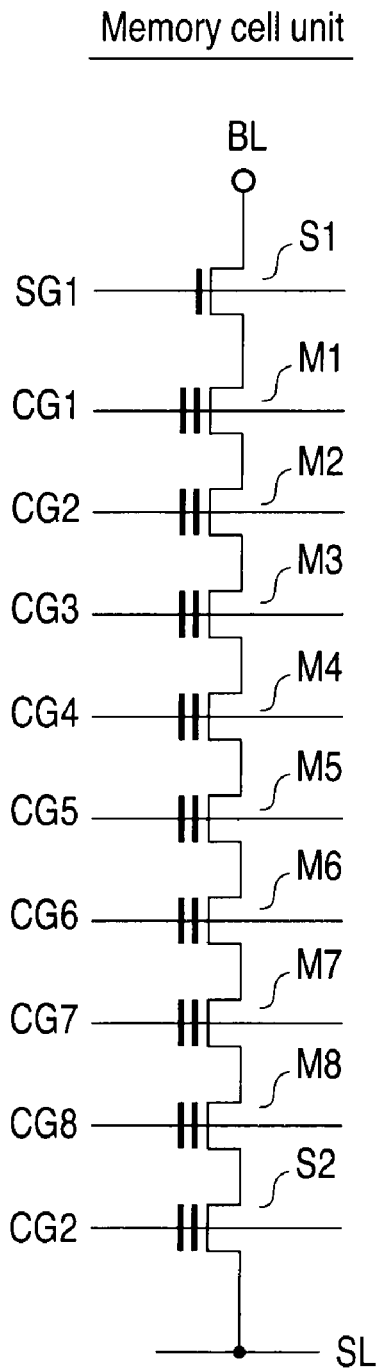
FIG. 3A
FIG. 3B

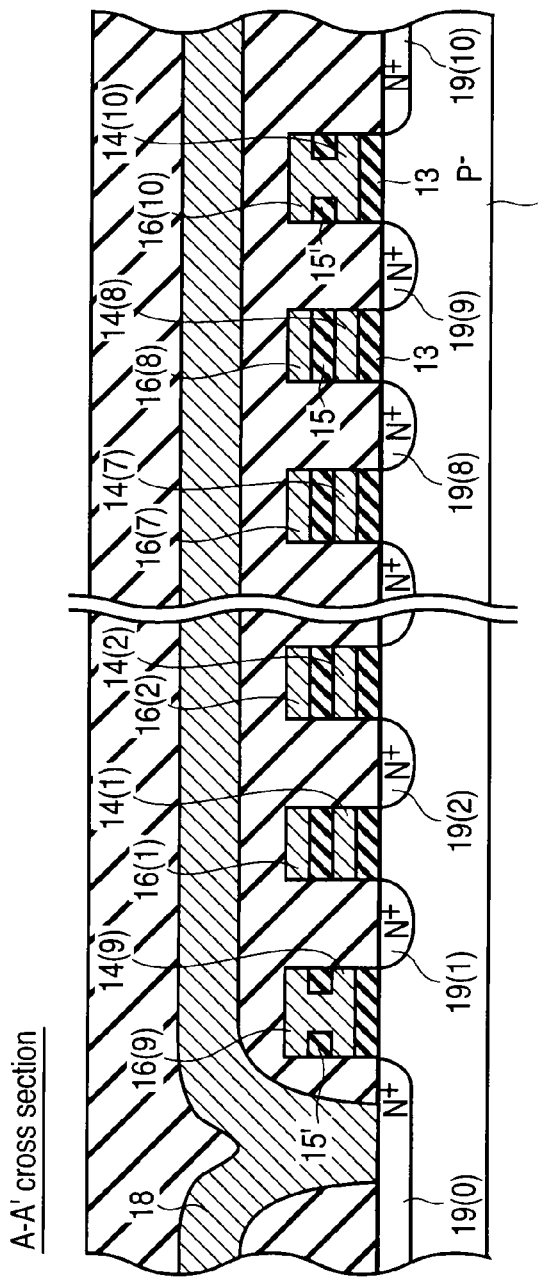
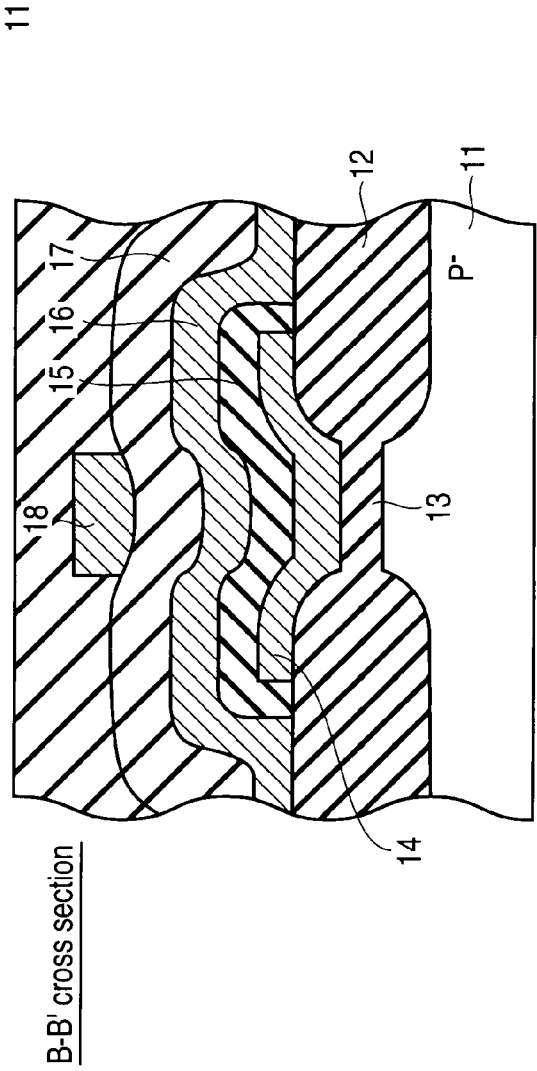
FIG. 4A
FIG. 4B

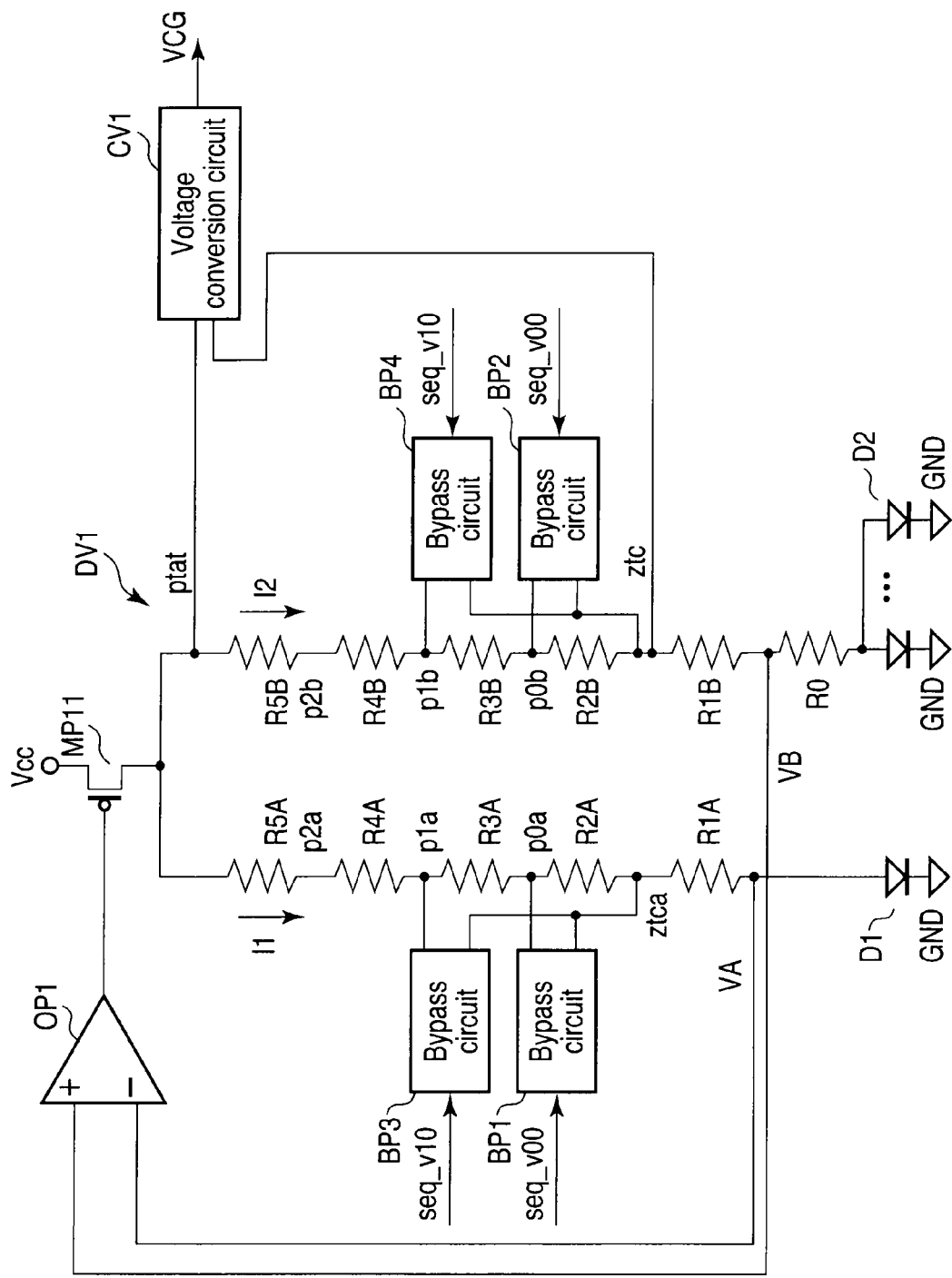
F I G. 6

Operational amplifier OP1

Bypass circuit BP1

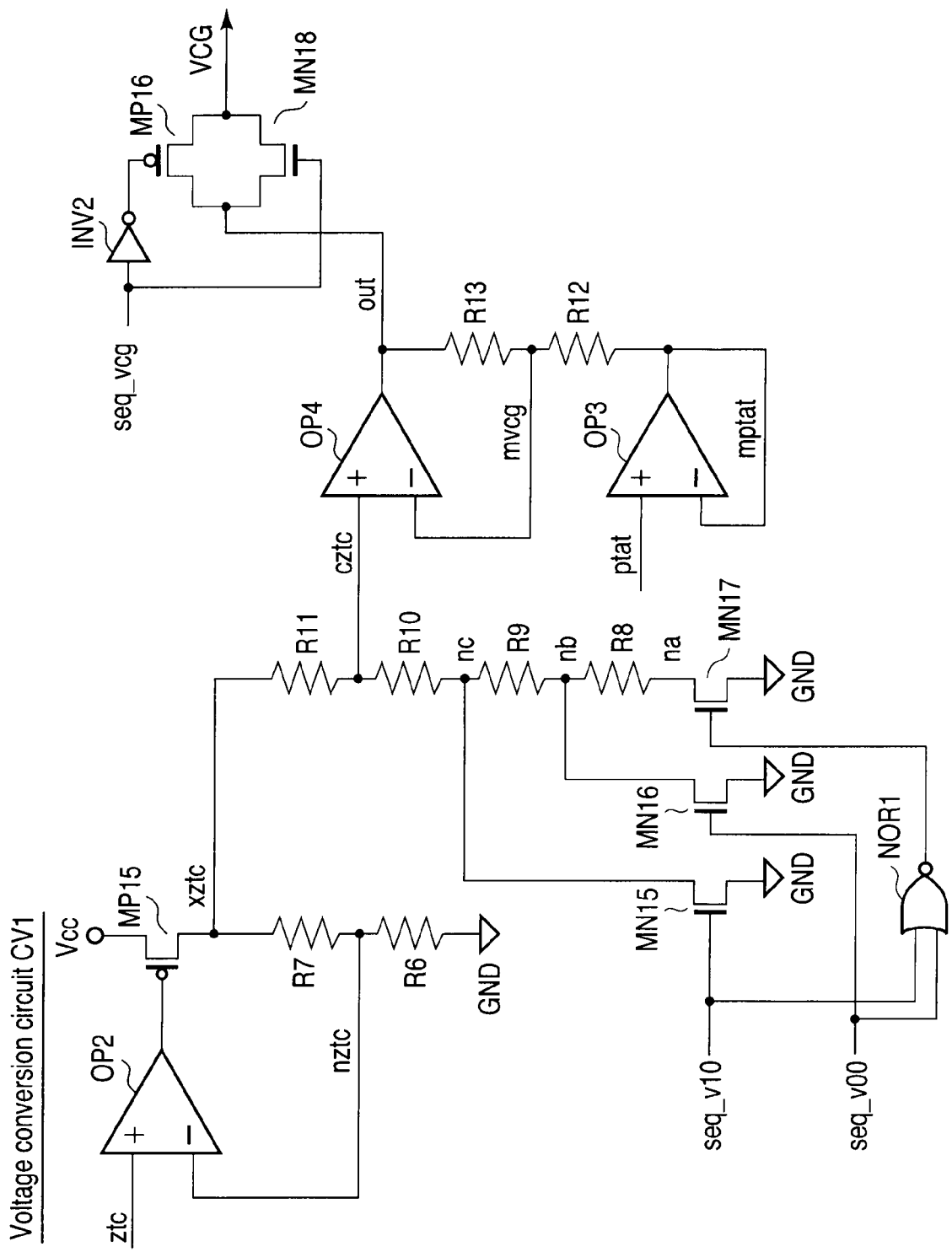
F I G. 9

| seq_00 | seq_10 | Output voltage | -40°C | 27°C | 85°C | Variation of voltage relative to temperature | |
|---|---|---|---|---|---|---|---|
| L | H | ptat | 1.32V | 1.35V | 1.38V | +0.5mV/°C | ⇨ "10" state |
| | | VCG | 0.85V | 0.75V | 0.66V | -1.5mV/°C | |
| H | L | ptat | 1.39V | 1.44V | 1.49V | +0.8mV/°C | ⇨ "00" state |
| | | VCG | 2.24V | 2.08V | 1.94V | -2.4mV/°C | |
| L | L | ptat | 1.43V | 1.50V | 1.56V | +1.0mV/°C | ⇨ "01" state |
| | | VCG | 3.70V | 3.50V | 3.32V | -3.0mV/°C | |

F I G. 10

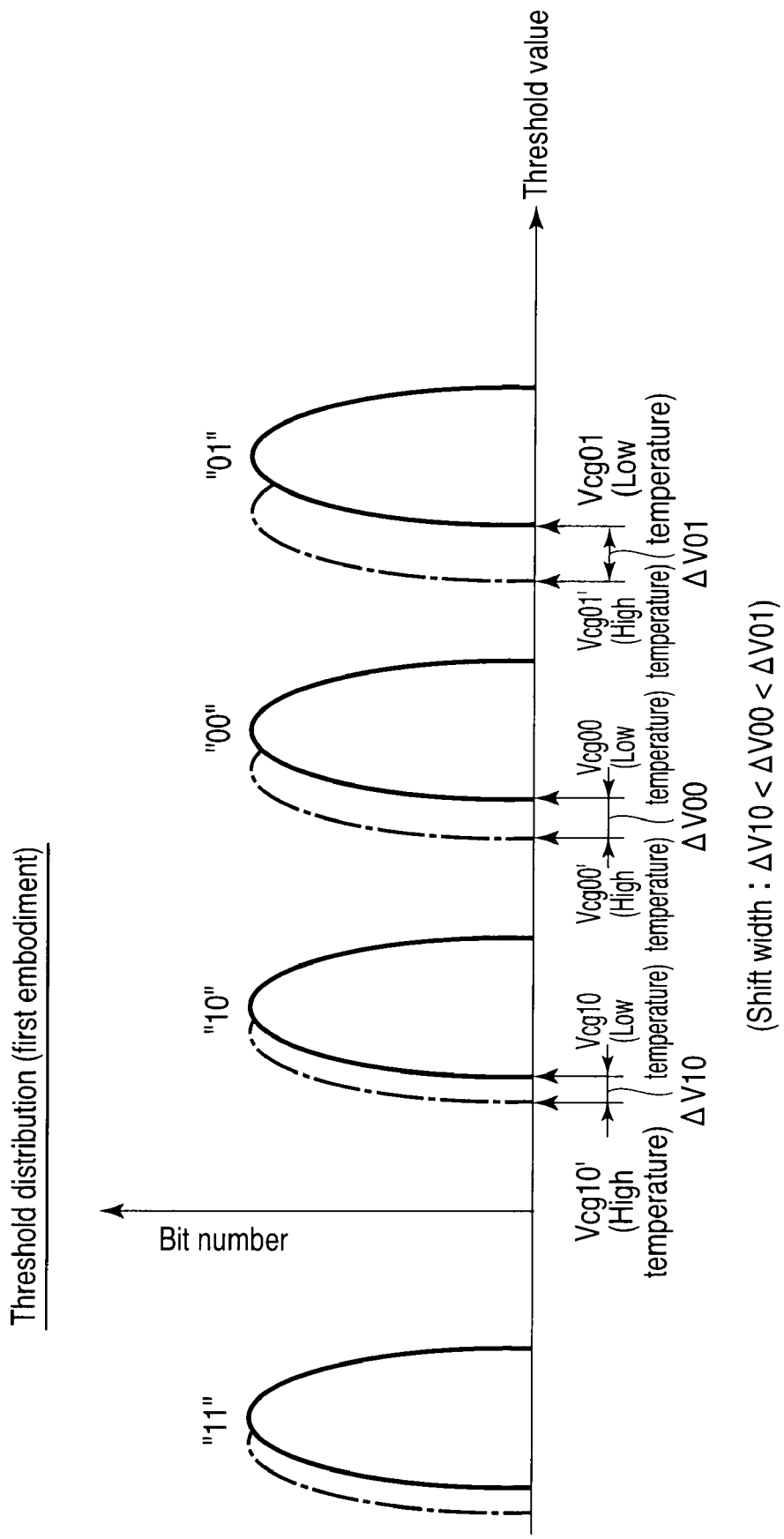
F I G. 12

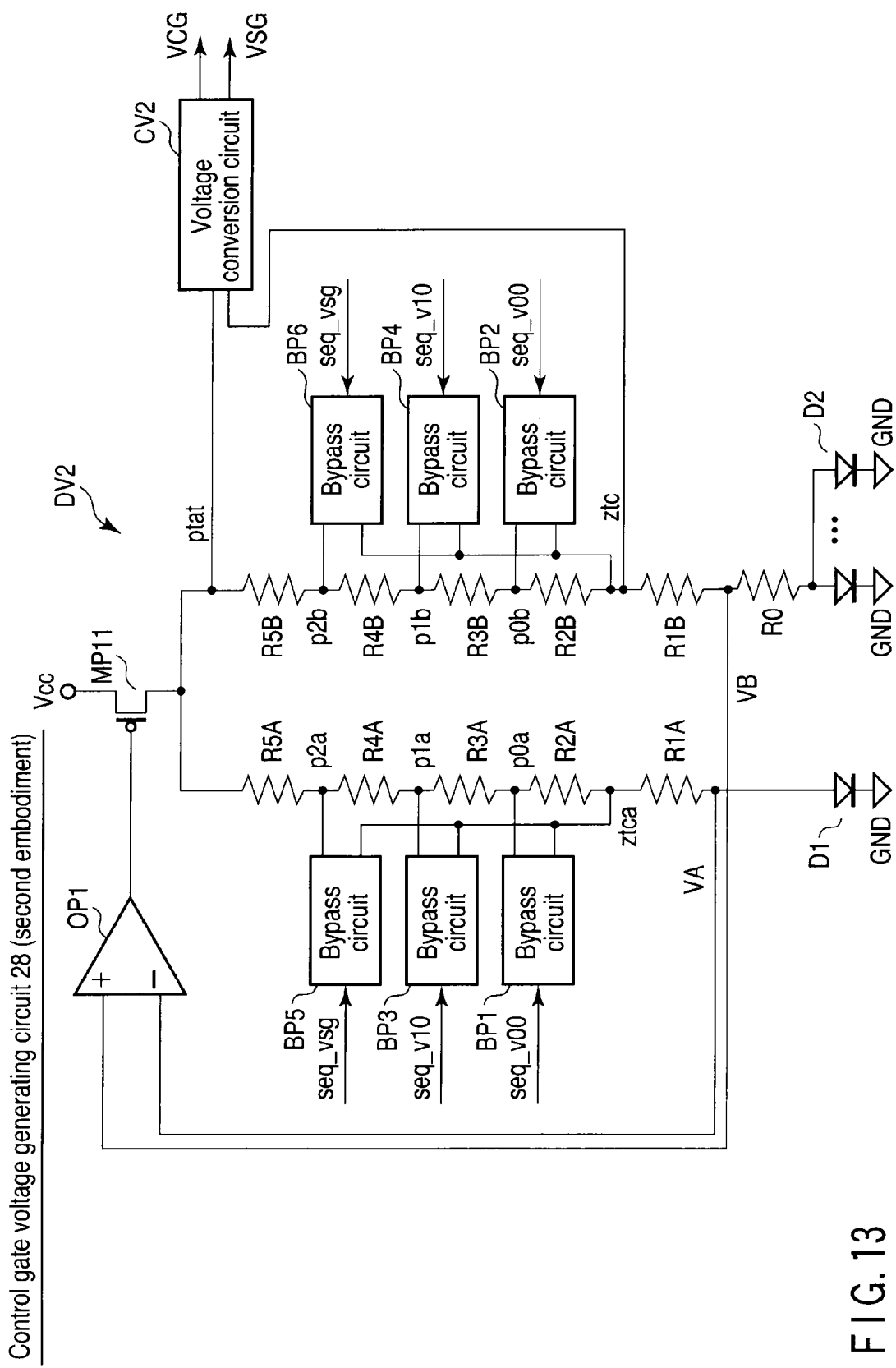
F I G. 13

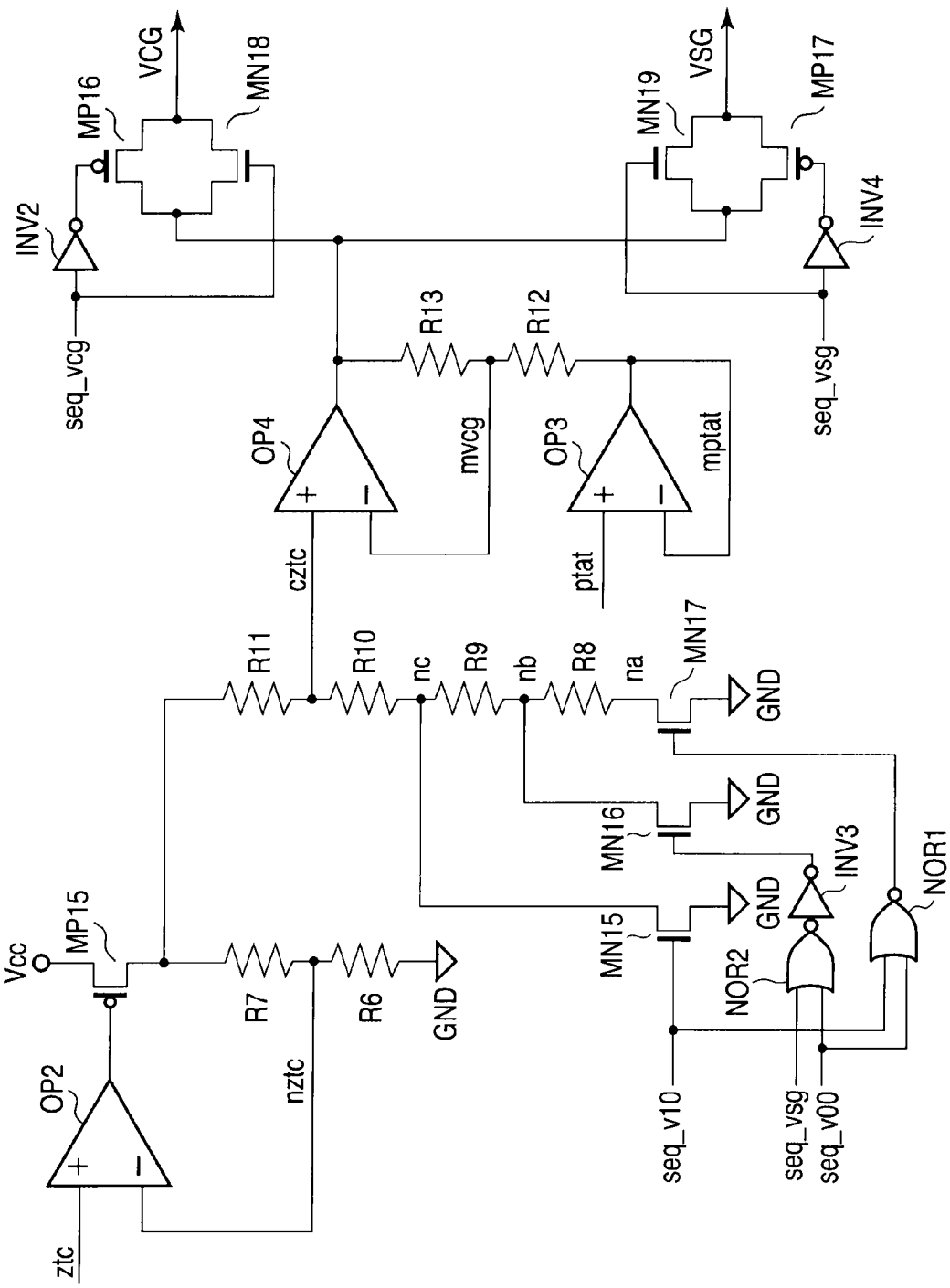
F I G. 14

Second embodiment
| Output voltage | -40°C | 27°C | 85°C | Variation of voltage relative to temperature |
|---|---|---|---|---|
| ptat | 1.29V | 1.32V | 1.34V | +0.4mV/°C |
| VSG | 2.52V | 2.44V | 2.73V | -1.2mV/°C |
F I G. 15
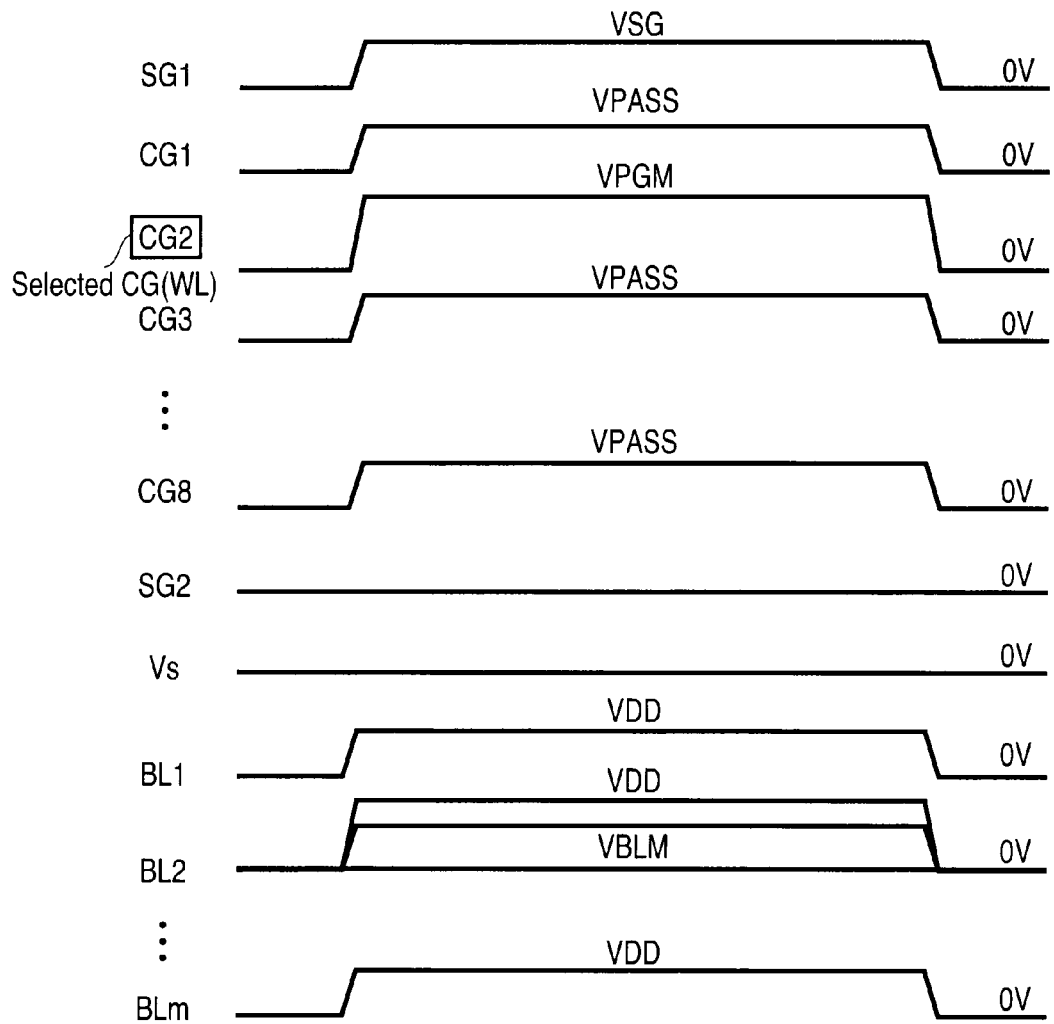
F I G. 16

SEMICONDUCTOR MEMORY DEVICE

CROSS-REFERENCE TO RELATED APPLICATIONS

This application is based upon and claims the benefit of priority from prior Japanese Patent Application No. 2007-297024, filed Nov. 15, 2007, the entire contents of which are incorporated herein by reference.

BACKGROUND OF THE INVENTION

1. Field of the Invention

The present invention relates to a semiconductor memory device.

2. Description of the Related Art

There is known a NAND flash memory in which a plurality of threshold voltages are provided in order to enable storage of multi-bit data in one memory cell transistor. For example, in the case of four-value data, four threshold voltages (Vth0, Vth1, Vth2, Vth3) are provided, and thereby these data are stored in association with threshold voltages of "11", "10", "00" and "01".

At the time of memory cell data read, write verify and erase verify (hereinafter simply referred to as "read time"), a voltage that is applied to the gate of the memory cell is set at a voltage between two kinds of threshold values. For example, for the purpose of simple description, if consideration is given of the case in which there are only cells which are in the states of Vth0 and Vth1, the gate voltage VCG is set at a value of Vth0<VCG<Vth1. In the case where data read is executed from the memory cell with the threshold voltage Vth0 in this state, the memory cell is set in the ON state and a drain current flows. On the other hand, when data read is executed from the memory cell with the threshold voltage Vth1, the memory cell is set in the OFF state, and no drain current flows. By detecting such a drain current, memory cell data can be read out.

If the temperature varies, like ordinary transistors, the threshold value of the memory cell transistor varies accordingly. On the other hand, since the gate voltage at the time of read is, e.g. a power supply voltage or a voltage which is generated by dividing the power supply voltage, the voltage level does not vary even if there is a temperature variation. Thus, in order to correctly read out data even if there is a variation in threshold value due to the temperature variation, it is necessary to secure a sufficient potential difference (voltage margin) between the threshold values.

However, if the power supply voltage lowers or if four or more kinds of threshold voltages are provided in the memory cell in order to increase the amount of information per unit memory cell, there is a tendency that a sufficiently large voltage margin cannot be secured.

In order to secure a read voltage margin, it has been proposed that the voltage VCG, which is applied to the gate of the memory cell at the time of read, is provided with temperature dependency that is similar to the temperature dependency of the memory cell (see, e.g. Jpn. Pat. Appln. KOKAI Publication No. 2006-196078).

In recent years, however, if the degree of microfabrication of memory cells further progresses, there is such a problem that memory cell data cannot correctly be read out at high temperatures, and the number of defective bits increases. Even in the case where memory cell data in the "10" state with a low threshold value can correctly be read out, memory cell data in the "00" state or "01" state with a high threshold value, in particular, cannot correctly be read out at high temperatures. Consequently, if the memory cell data in the "00" state or "01" state with a high threshold value is to be read out, the number of defective bits increases.

It is thought that this occurs due to the conspicuous effect of a parasitic transistor of the memory cell. The memory cell causes a current flow, which depends on the voltage that is applied to the control electrode (control gate) in accordance with electrons which are retained in the floating electrode (floating gate).

If the degree of microfabrication progresses, the size of the memory cell becomes smaller, and the channel length at the end of the memory cell decreases. If the voltage of the control electrode is applied to the channel with the decreased length, a parasitic transistor, which causes leak current, occurs. It is considered that such a parasitic transistor becomes obvious with the progress of microfabrication of the process.

The parasitic transistor has such a feature that a more electric current is caused to flow as the voltage that is applied to the control electrode becomes higher. Hence, it becomes difficult to correctly read out memory cell data of, in particular, the memory cell in the "01" state with the highest threshold voltage, which greatly varies due to the temperature variation.

BRIEF SUMMARY OF THE INVENTION

According to an aspect of the present invention, there is provided a semiconductor memory device comprising: a memory cell array in which a plurality of memory cells are arranged in a matrix; a read unit which reads out data from the memory cells in the memory cell array; a write unit which writes data in the memory cells in the memory cell array; a read voltage generating unit which generates a read voltage and supplies the read voltage to the read unit; and a voltage control unit which controls the read voltage in accordance with temperatures.

BRIEF DESCRIPTION OF THE SEVERAL VIEWS OF THE DRAWING

FIG. 2 is an equivalent circuit diagram showing a memory cell array which is included in the semiconductor memory device according to the first embodiment;

FIG. 3A is a plan view showing a memory cell unit;

FIG. 3B is an equivalent circuit diagram showing a memory cell unit;

FIG. 4A is a cross-sectional view taken along line A-A' in FIG. 3A;

FIG. 4B is a cross-sectional view taken along line B-B' in FIG. 3A;

FIG. 6 is an equivalent circuit diagram showing a control gate voltage generating circuit according to the first embodiment;

FIG. 9 is an equivalent circuit diagram showing a voltage conversion circuit in FIG. 6;

FIG. 10 shows a relationship between a control gate voltage and a temperature in the first embodiment;

FIG. 12 shows a threshold distribution at a time of a high temperature and at a time of a low temperature in the semiconductor memory device according to the first embodiment;

FIG. 13 is an equivalent circuit diagram showing a control gate voltage generating circuit which is included in a semiconductor memory device according to a second embodiment of the present invention;

FIG. 14 is an equivalent circuit diagram showing a voltage conversion circuit in FIG. 13;

FIG. 15 shows a relationship between a select gate voltage and a temperature according to the second embodiment;

FIG. 16 is a waveform diagram at the time of a read operation of the semiconductor memory device according to the second embodiment;

DETAILED DESCRIPTION OF THE INVENTION

Figure 1:
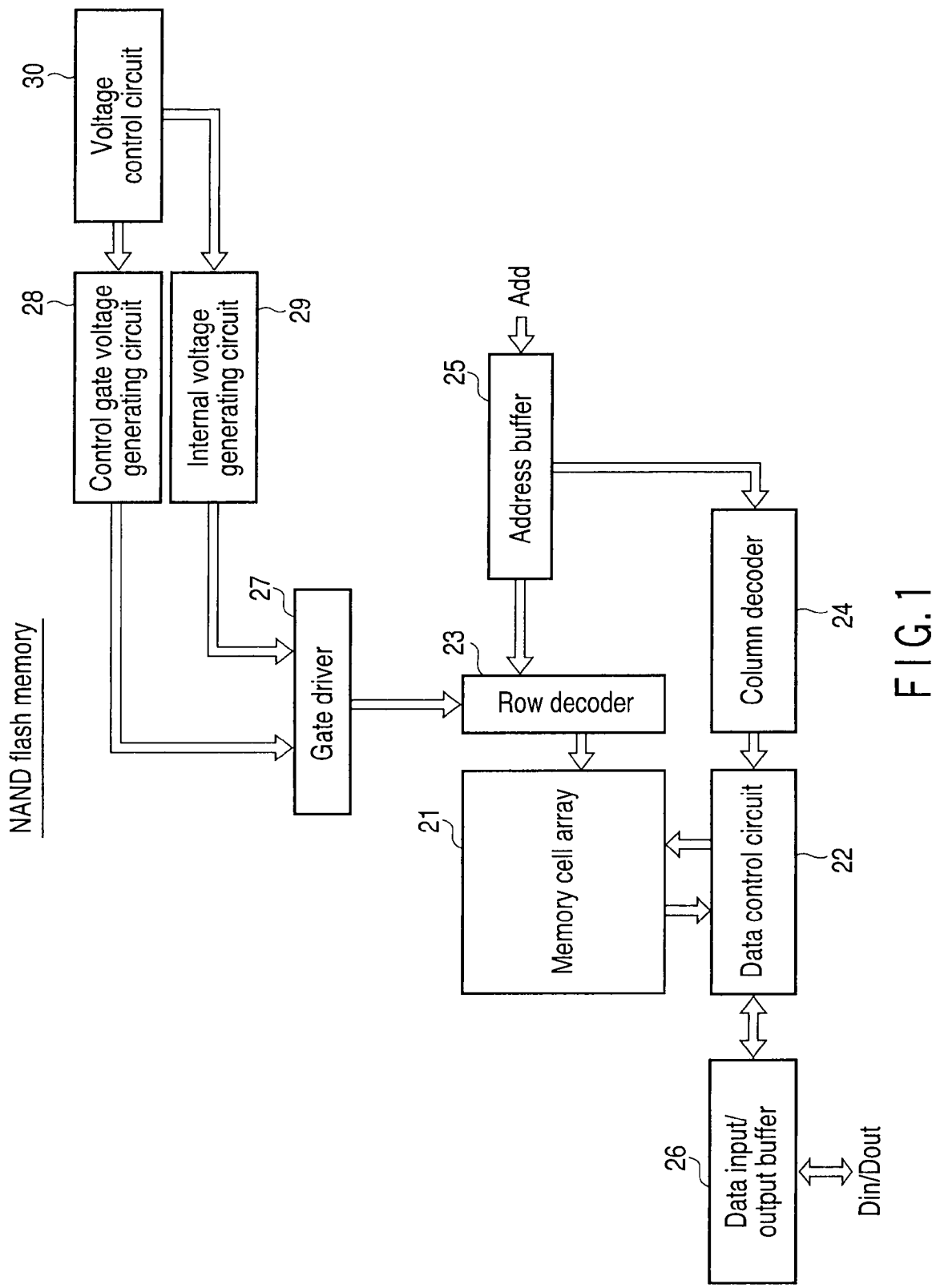
FIG. 1 is a block diagram showing an example of the entire structure of a semiconductor memory device according to a first embodiment of the present invention.

Embodiments of the present invention will now be described with reference to the accompanying drawings.

In the description below, a NAND flash memory is described by way of example. In the following description, common parts are denoted by like reference numerals throughout the drawings.

First Embodiment

1. Structure Example 1-1. Example of Entire Structure

To begin with, referring to FIG. 1, a description is given of an example of the entire structure of a semiconductor memory device according to a first embodiment of the present invention. As shown in FIG. 1, a NAND flash memory according to this embodiment comprises a memory cell array 21, a data control circuit 22, a row decoder 23, a column decoder 24, an address buffer 25, a data input/output buffer 26, a gate driver 27, a control gate (CG) voltage generating circuit 28, an internal voltage generating circuit 29 and a voltage control circuit 30.

The memory cell array 21 is composed of a plurality of blocks (BLOCK). Each block includes a plurality of memory cell transistors (memory cells) which are disposed in a matrix at intersections between bit lines and word lines (control gate lines). Since each of the memory cell transistors is configured to be able to store multi-bit data, each memory cell transistor has a plurality of threshold voltages, as will be described later.

The data control circuit (data read unit) 22 detects, amplifies and temporarily stores data which is read out of the memory cell transistor in the memory cell array 21. In addition, the data control circuit 22 temporarily stores write data which is supplied from the data input/output buffer 26.

The row decoder 23 decodes a row address signal which is output from the address buffer 25, and selects a word line which is formed in the memory cell array.

The column decoder 24 decodes a column address signal which is output from the address buffer 25, and selects a bit line which is formed in the memory cell array.

The address buffer 25 receives an address signal Add from the outside (not shown) of the device.

The data input/output buffer 26 supplies write data Din, which is input from the outside of the device, to the data control circuit 22, and outputs read data Dout, which is supplied from the data control circuit 22, to the outside of the device.

The gate driver 27 receives an output voltage VCG of the control gate voltage generating circuit 28, and output voltages VPGM and VPASS of the internal voltage generating circuit 29. Thus, the gate driver 27 functions as a switch circuit which selectively transfers the above-mentioned voltages to the word lines in the memory cell array via the row decoder 23.

The control gate voltage generating circuit (read voltage generating unit) 28 generates, at a time of read, a read voltage VCG, for instance, which is applied to a selected word line, on the basis of a control signal from the voltage control circuit 30.

The internal voltage generating circuit 29 generates, on the basis of a control signal from the voltage control circuit 30, a write voltage VPGM which is applied to a selected word line at a time of write, a write pass voltage VPASS which is applied to a non-selected word line at a time of write, and voltages VSGH and VSG which are applied to a selected gate line.

The voltage control circuit (voltage control unit) 30 controls the read voltage VCG in accordance with temperatures, as will be described later. To be more specific, at a time of high temperatures (e.g. about 85° C.), the voltage control circuit 30 controls the read voltage so as to shift the read voltage to a lower level in such a manner that the shift width increases as the threshold voltage becomes higher. Thus, even in the case where data is to be read, at high temperatures, out of the memory cell transistor that is in the "00" state or "01" state with a high threshold value, the data can correctly be read out and the number of defective bits can be decreased.

1-2. Structure Example of Memory Cell Array

Next, a structure example of the memory cell array 21 according to the present embodiment is described with reference to FIG. 2. FIG. 2 shows an equivalent circuit of the memory cell array 21 according to this embodiment.

As shown in FIG. 2, the memory cell array 21 is composed of a plurality of blocks (BLOCK1, BLOCK2, . . . ). In FIG. 2, two blocks (BLOCK1, BLOCK2) are shown by way of example.

Each of the blocks includes a plurality of memory cell units MU, and select transistors S1 and S2 which select an associated memory cell unit MU.

The memory cell unit MU is composed of a plurality of memory cell transistors (M1 to M8) which have current paths connected in series in a row direction. Each of the memory cell transistors has a multi-layer structure including a tunnel insulation film, a floating electrode FG, an inter-gate insulation film and a control electrode CG, which are successively provided in the named order on a semiconductor substrate. The select transistor S1, S2 includes a gate insulation film and a gate electrode, which are provided on the semiconductor substrate.

Control gate lines (word lines) CG1, CG2, . . . , CG8, select gate lines SG1, SG2, and a source line SL are arranged in the row direction. The control gate lines CG1 to CG8 are connected to the control electrodes CG of the memory cell transistors. The select gate lines SG1 and SG2 are connected to the gate electrodes of the select transistors S1 and S2.

The source line SL is connected to one end of the current path of each memory cell unit MU. The source line SL is shared by blocks (e.g. BLOCK2 and BLOCK3 (not shown))

neighboring in a column direction. A source potential Vs, which is generated by a peripheral circuit (not shown), is applied to the source line SL.

Bit lines BL1, BL2, . . . , BLm are arranged in the column direction. The bit lines BL1 to BLn are connected to the other ends of the current paths of the memory cell units MU.

A page (PAGE) is provided in each of the control gate lines (word lines). Data write and data read are executed in units of the page (PAGE). Thus, the page is a write unit and a read unit. Since data erase is executed in units of the block (BLOCK1, BLOCK2, . . . ), the block (BLOCK1, BLOCK2, . . . ) is an erase unit.

1-3. Structure Example of Memory Cell Unit

Next, a structure example of the memory cell unit MU according to the present embodiment will now be described with reference to FIGS. 3A and 3B and FIGS. 4A and 4B. FIG. 3A is a plan view showing a plan-view structure of the memory cell unit, and FIG. 3B is an equivalent circuit diagram of the memory cell unit. FIG. 4A is a cross-sectional view taken along line A-A' in FIG. 3A, and FIG. 4B is a cross-sectional view taken along line B-B' in FIG. 3A.

As shown in the Figures, the memory cell unit includes a plurality of memory cell transistors each having an N-channel MOSFET structure wherein a floating electrode and a control electrode, for instance, are stacked as a charge accumulation layer. These memory cell transistors are series-connected, with their source terminals and drain terminals being shared between neighboring memory cell transistors. The series-connected memory cell transistors are connected to the bit line BL. In this example, eight memory transistors M1 to M8 are connected in series, thus constituting one memory cell unit.

In each of the memory cell transistors M1 to M8, a floating electrode 14 (14(1), 14(2), . . . , 14(8)) is formed via a gate insulation film (tunnel insulation film) 13 on a P-type well 11 which is formed in a semiconductor substrate. A control electrode 16 (16(1), 16(2), . . . , 16(8)) is stacked on the floating electrode 14 via an inter-gate insulation film 15. The memory cells are connected in series in such a manner that N-type diffusion layers 19 (19(1), 19(2), . . . , 19(9)), which are sources and drains of the memory cell transistors, are shared by the transistors neighboring in the row direction. The memory cell transistors, which neighbor in the row direction (bit line direction), are isolated by a device isolation oxide film 12.

A first select transistor S1 and a second select transistor S2 are provided on the drain side and source side of the memory cell unit. The select transistor S1 includes first select gates 14(9) and 16(9) which are formed at the same time as the floating electrode and control electrode of the memory cell transistor. The select transistor S2 includes second select gates 14(10) and 16(10) which are formed at the same time as the floating electrode and control electrode of the memory cell transistor. The select gates 14(9) and 16(9) are electrically connected via a central slit portion of an inter-gate insulation film 15'.

Similarly, the select gates 14(10) and 16(10) are electrically connected via a central slit portion of an inter-gate insulation film 15'. Thereby, these gates function as the gate electrodes of the select transistors S1 and S2.

These elements (M1 to M8, S1, S2) are covered with an interlayer insulation film 17.

A bit line 18 (BL) is provided on the interlayer insulation film 17.

The control electrodes 16(1), 16(2), . . . , 16(8) are commonly disposed in the row direction and function as control gate lines CG1, CG2, . . . , CG8. The select gates 14(9), 16(9), 14(10), 16(10) are also commonly disposed in the row direction and function as select gate lines SG1 and SG2.

Data write is executed batchwise in one page by injecting charge (electrons) in the floating electrodes 14 (14(1), 14(2), . . . , 14(8)) of the memory cell transistors M1 to M8. Data erase is executed batchwise in one block by draining the injected charge (electrons).

1-4. Example of Threshold Distribution

Figure 5:
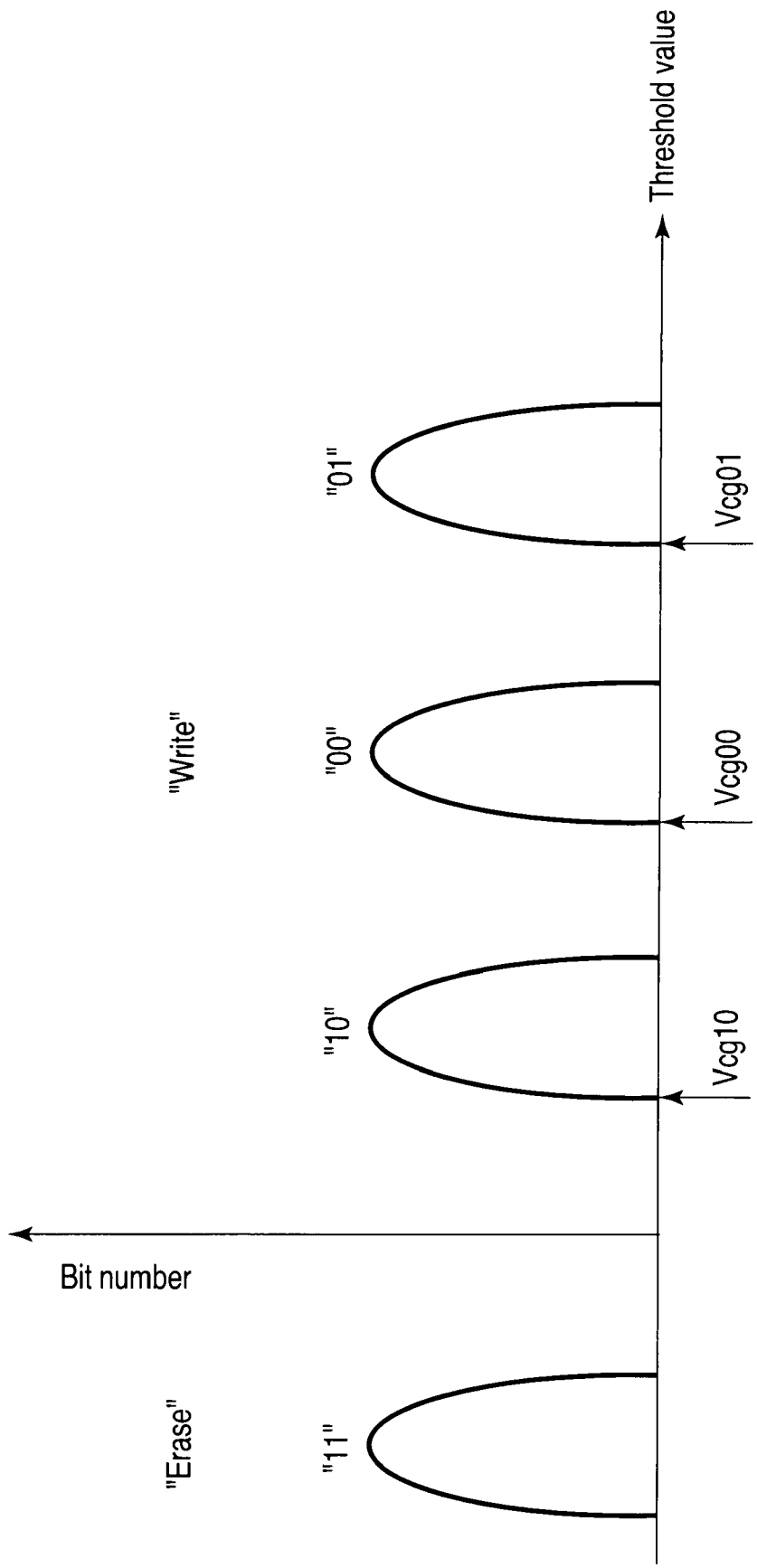
FIG. 5 shows a threshold distribution of the semiconductor memory device according to the first embodiment.

Next, referring to FIG. 5, a description is given of the threshold distribution of the memory cell transistor according to the present embodiment. FIG. 5 shows a distribution of threshold voltages in each memory cell transistor, M1 to M8. In this example, four values, that is, four kinds of threshold voltages, are set in the memory cell transistor.

As shown in FIG. 5, a "11" state is an erase state, a "10" state is a Vth10 write state, a "00" state is a Vth00 write state, and a "01" state is a Vth01 write state.

1-5. Structure Example of Control Gate Voltage Generating Circuit

Next, a structure example of the control gate voltage generating circuit 28 according to the present embodiment is described with reference to FIG. 6.

As shown in FIG. 6, the control gate voltage generating circuit 28 according to the present embodiment comprises a voltage division circuit DV1 and a voltage conversion circuit CV1. The voltage division circuit DV1 generates a resistor-divided voltage in accordance with control signals seq_v10 and seq_v00 from the voltage control circuit 30. The voltage conversion circuit CV1 converts the output of the voltage division circuit DV1 to a predetermined control gate voltage VCG.

The voltage division circuit DV1 comprises an operational amplifier OP1, a P-channel MOS transistor MP11, resistors R0, R1A-R5A and R1B-R5B, diodes D1 and D2, and bypass circuits BP1 to BP4.

An anode of the diode D1 is connected, as VA, to a non-inversion input terminal (+) of the operational amplifier OP1 and also to one terminal of the resistor R1A. Anodes of an N-number of diodes D2 are commonly connected to one terminal of the resistor R0. The other terminal of the resistor R0 is connected to an inversion input terminal (−) of the operational amplifier OP1 and also to one terminal of the resistor R1B. The cathodes of the diodes D1 and D2 are connected to a ground potential GND.

The other terminal of the resistor R1A is connected, as ztca, to one terminal of the resistor R2A, and the other terminal of the resistor R1B is connected, as ztc, to one terminal of the resistor R2B. In addition, ztca is connected to the bypass circuits BP1 and BP3, and ztc is connected to the bypass circuits BP2 and BP4. The other terminal of the resistor R2A is connected, as p0a, to one terminal of the resistor R3A, and the other terminal of the resistor R2B is connected, as p0b, to one terminal of the resistor R3B. In addition, p0a and p0b are connected to the bypass circuits BP1 and BP2, respectively. The other terminal of the resistor R3A is connected, as p1a, to one terminal of the resistor R4A, and the other terminal of the resistor R3B is connected, as p1b, to one terminal of the resistor R4B. In addition, p1a and p1b are connected to the bypass circuits BP3 and BP4, respectively. The other terminal of the resistor R4A is connected, as p2a, to one terminal of the resistor R5A, and the other terminal of the resistor R4B is connected, as p2b, to one terminal of the resistor R5B.

The other terminals of the resistors R5A and R5B are connected, as ptat, to a drain of the P-channel MOS transistor MP11. An output terminal of the operational amplifier OP1 is connected to the gate of the MP11, and the source of the MP11 is supplied with a power supply voltage Vcc.

The bypass circuit BP1, BP2 switches short/open between one terminal of the resistors R2A, R2B and other terminals of the resistors R2A, R2B. Similarly, the bypass circuit BP3 switches short/open between one terminal of the resistor R3A and other terminal of the resistors R2A. The bypass circuit BP4 switches short/open between one terminal of the resistor R3B and other terminal of the resistors R2B. A control signal seq_v00 from the voltage control circuit 30 is supplied to the bypass circuits BP1 and BP2, and a control signal seq_v10 from the voltage control circuit 30 is supplied to the bypass circuits BP3 and BP4.

The voltage conversion circuit CV1 is connected to ptat and ztc, and outputs a control gate (CG) voltage VCG. Equal resistance values are set between the resistors R1A and R1B, between the resistors R2A and R2B, between the resistors R3A and R3B, between the resistors R4A and R4B, and between the resistors R5A and R5B.

1-6. Structure Example of Operational Amplifier

Figure 7:
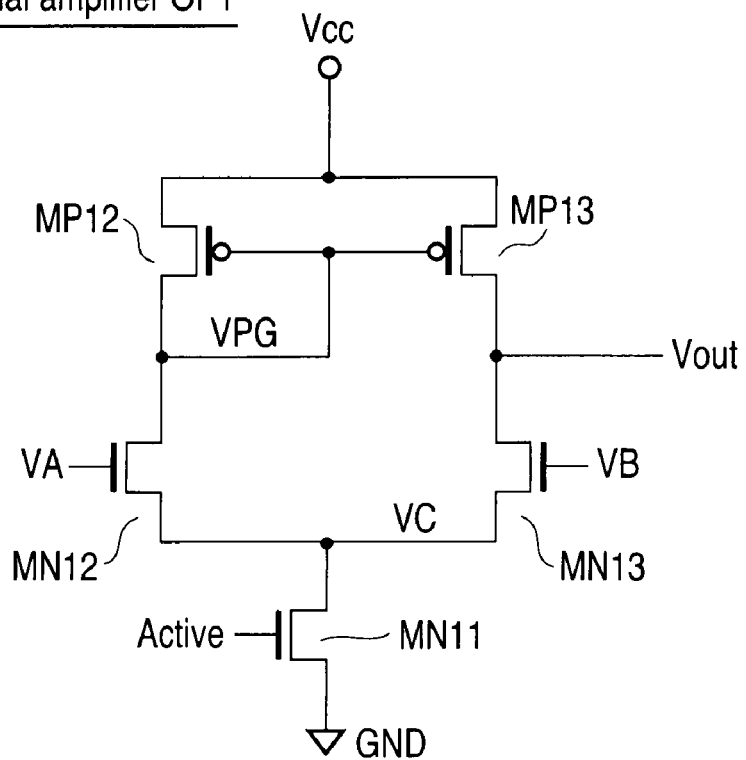
FIG. 7 is an equivalent circuit diagram showing an operational amplifier in FIG. 6.

Next, a structure example of the operational amplifier OP1 in FIG. 6 is described with reference to FIG. 7. As shown in FIG. 7, the operational amplifier OP1 is composed of P-channel MOS transistors MP12 and MP13, and N-channel MOS transistors MN11, MN12 and MN13.

The source of the N-channel MOS transistor MN11 is connected to a ground potential GND, and the gate thereof is supplied with a signal Active from the voltage control circuit 30. The drain of the N-channel MOS transistor MN11 is commonly connected, as VC, to the sources of the N-channel MOS transistors MN12 and MN13. The gate of the N-channel MOS transistor MN12 is supplied with a signal VA, and the drain thereof is commonly connected, as VPG, to the drain of the P-channel MOS transistor MP12 and to the gates of the MP12 and MP13. The gate of the N-channel MOS transistor MN13 is supplied with a signal VB, and the drain thereof is connected, as Vout, to the drain of the P-channel MOS transistor MP13, and Vout is produced as an output of the operational amplifier OP1. The sources of the MP12 and MP13 are connected to a power supply voltage Vcc.

The operational amplifier OP1 operates when the Active signal transitions to an "H" state. When VA>VB, a greater current is caused to flow in the MN12, compared to the MN13. This lowers VPG toward the GND level, and a greater current flows through the MP12 and MP13. Thus, Vout of the "H" level is output. On the other hand, when VA<VB, a greater current is caused to flow in the MN13, compared to the MN12. As a result, Vout of the "L" level is output.

As described above, when the operational amplifier OP1 is set in the operation state, the operational amplifier OP1 functions as a differential amplifier, and controls the current, which flows through the MP11, in a manner to equalize the voltages VA and VB.

On the basis of the conditions, VA=VB and I1=I2, the voltage Vztc of ztc is expressed by $$Vztc = Vf + (r1/r0)*(kT/q*\ln(N))$$

where Vf is a forward voltage of the diode, k is a Boltzmann constant, T is an absolute temperature, q is a charge elementary quantity, N is an area ratio between the diodes D1 and D2 (the ratio of area of D2 to D1), r0 is a resistance value of R0, and r1 is a resistance value of R1A, R1B. As is understood by differentiating this formula by the absolute temperature, ztc can be set at a voltage which is free from temperature dependency, by setting a proper r1/r0.

If the differential value of Vf by the absolute temperature is $-2$ mV/C, $k=1.38*10^{\wedge}(-23)$, $q=1.6*10^{\wedge}(-19)$, and $N=10$, then $(r1/r0)=10.08$ under the condition that ztc is free from the temperature dependency. Although the values of r0 and r1 are not uniquely determined, $r0=10$ k and $r1=100.8$ k, for example. The voltage Vztc of ztc in this case is Vztc=1.20V if T=27 C and Vf=0.6V.

In addition, the voltage Vptat of ptat is expressed by the following equation (1):

$$Vptat = Vf + ((r1+r2+r3+r4+r5)/r0)*(kT/q*\ln(N)) \qquad \text{equation (1)}$$

In the case where ztc is set to meet the condition that ztc is free from temperature dependency, the temperature dependency of ptat is given by the following equation (2):

$$d(Vptat)/dT = d(Vf)/dT + ((r1+r2+r3+r4+r5)/r0)*(k/q*\ln(N)) = ((r2+r3+r4+r5)/r0)*(k/q*\ln(N)) \qquad \text{equation (2),}$$

where r2, r3, r4 and r5 are representative of the resistance values of the resistors R2A and R2B, the resistors R3A and R3B, the resistors R4A and R4B, and the resistors R5A and R5B.

As is understood from the equation (2), the temperature dependency can arbitrarily be set by the sum (r2+r3+r4+r5) of the resistance values of the resistors R2A, R3A, R4A and R5A. For example, if (r2+r3+r4+r5)=50.4 kΩ, the temperature dependency of the ptat voltage Vptat is 1.0 mV/C. The ptat voltage Vptat at this time is Vptat=1.50V, if T=27 C and Vf=0.6V.

1-7. Structure Example of Bypass Circuit

Figure 8:
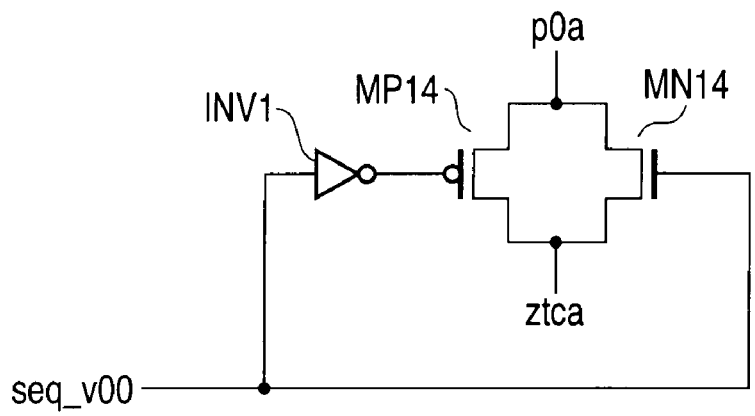
FIG. 8 is an equivalent circuit diagram showing a bypass circuit in FIG. 6.

Next, referring to FIG. 8, a structure example of the bypass circuit is described. The bypass circuit BP1 is described by way of example. As described above, the bypass circuits BP1, BP2, BP3 and BP4 short-circuit both ends of the resistors, thereby varying the resistance values between ztca, ztc and ptat and varying the temperature dependency of the ptat voltage Vptat.

As shown in FIG. 8, the bypass circuit BP1 comprises an inverter INV1, an N-channel MOS transistor MN14, and a P-channel MOS transistor MP14.

The control signal seq_v00 from the voltage control circuit 30 is supplied to the input terminal of the inverter INV1 and the gate of the N-channel MOS transistor MN14, and the output terminal of the inverter INV1 is connected to the gate of the P-channel MOS transistor MN14. The source of the MN14 and the drain of the MP14 are commonly connected to the node ztca between the resistors R1A and R2A, and the drain of the MN14 and the source of the MP14 are commonly connected to the node p0a between the resistors R2A and R3A.

In this circuit, in the state in which the seq_v00 signal at "L" level is output, the MP14 and MN14 are in the OFF state. Since the nodes ztca and p0a are connected via the resistor R2A, the resistance value therebetween is r2. In the state in which the seq_v00 signal at "H" level is output, the MP14 and MN14 are in the ON state. Thus, the nodes ztca and p0a are in the short-circuited state, and the resistance value therebetween is zero. The same applies to the operations of the bypass circuits BP2, BP3 and BP4.

In the state of seq_v00="H", the bypass circuit BP2 sets the resistance value between ztc and p0b at zero. In the state of seq_v10="H", the BP3 and BP4 set the resistance value between ztca and p1a and the resistance value between ztc and p1b at zero, respectively.

From the above-described equation (2), the temperature dependency of the ptat voltage Vptat can be set by the sum (r2+r3+r4+r5) of the resistance values of the resistors R2A, R3A, R4A and R5A. Thus, the temperature dependency of Vptat can be varied by the bypass circuits BP1, BP2, BP3 and BP4.

For example, if (r2+r3+r4+r5)=50.4 kΩ, r2=10.1 kΩ, and r3=15.1 kΩ, the following is given.

1) When seq_v00="L", and seq_v10="H",
the temperature dependency of ptat is 0.5 mV/° C., and
the ptat voltage Vptat is 1.35V (temperature: 27° C., Vf=0.6V).
2) When seq_v00="H", and seq_v10="L",
the temperature dependency of ptat is 0.8 mV/° C., and
the ptat voltage Vptat is 1.44V (temperature: 27° C., Vf=0.6V).
3) When seq_v00="L", and seq_v1="L",
the temperature dependency of ptat is 1.0 mV/c, and
the ptat voltage Vptat is 1.50V (temperature: 27° C., Vf=0.6V).

1-8. Structure Example of Voltage Conversion Circuit

Next, referring to FIG. 9, a structure example of the voltage conversion circuit CV1 is described.

On the basis of the ptat signal and the ztc signal, the voltage conversion circuit CV1 generates, as VCG, a voltage which is controlled by the seq_v00 signal and seq_v10 signal. As shown in FIG. 9, the voltage conversion circuit CV1 comprises operational amplifiers OP2, OP3 and OP4, an inverter INV2, a NOR gate NOR1, P-channel MOS transistors MP15 and MP16, N-channel MOS transistors MN15, MN16, MN17 and MN18, and resistors R6, R7, R8, R9, R10, R11, R12 and R13.

The operational amplifiers OP2, OP3 and OP4 have the same structure as the operational amplifier OP1 which is shown in FIG. 7.

One terminal of the resistor R6 is connected to the GND, and the other terminal thereof is commonly connected to one terminal of the resistor R7 and an inversion input terminal (−) of the operational amplifier OP2. A non-inversion input terminal (+) of the OP2 is connected to ztc. An output terminal of the OP2 is connected to the gate of the P-channel MOS transistor MP15. The source of the MP15 is connected to Vcc, and the drain thereof is commonly connected, as xztc, to the other terminal of the resistor R7 and to one terminal of the resistor R11.

The control signal seq_v10 from the voltage control circuit 30 is commonly connected to the gate of the N-channel MOS transistor MN15 and to one input terminal of the NOR gate NOR1. The control signal seq_v00 is commonly connected to the gate of the N-channel MOS transistor MN16 and to the other input terminal of the NOR gate NOR1.

The output of the NOR 1 is connected to the gate of the N-channel MOS transistor MN17. The source of the MN17 is connected to the GND, and the drain thereof is connected, as na, to one terminal of the resistor R8. The source of the MN16 is connected to the GND, and the drain thereof is commonly connected, as nb, to the other terminal of the resistor R8 and one terminal of the resistor R9. The source of the MN15 is connected to the GND, and the drain thereof is commonly connected to the other terminal of the resistor R9 and one terminal of the resistor R10. The other terminal of the resistor R10 is connected, as cztc, to the other terminal of the resistor R11 and to a non-inversion input terminal (+) of the operational amplifier OP4. A non-inversion input terminal (+) of the operational amplifier OP3 is connected to the ptat. An inversion input terminal (−) of the OP3 is commonly connected to the output terminal of the OP3 and to one terminal of the resistor R12. The other terminal of the resistor R12 is commonly connected, as mvcg, to an inversion input terminal (−) of the OP4 and to one terminal of the resistor R13. The output terminal of the OP4 is connected, as an out signal, to the other terminal of the resistor 13.

A signal seq_vcg from the voltage control circuit 30 is commonly supplied to an input terminal of the inverter INV2 and to the gate of the N-channel MOS transistor MN18. The output terminal of the INV2 is connected to the gate of the P-channel MOS transistor MP16. The out signal is commonly supplied to the sources (or drains) of the MN18 and MP16, and the VCG is applied from the drains (or sources) of the MN18 and MP16 to the memory cell array via the gate driver 27 and row decoder 23.

The OP2 controls the gate voltage of the MP15 so as to equalize the voltages ztc and nztc. As a result, the voltage Vxztc of xztc is determined by the ratio between the resistance values of the resistors R6 and R7. In the case where the resistance values of the resistors R6 and R7 are r6 and r7, if r6=r7=100 k, then Vxztc=2.4V (27 C, Vf=0.6V).

The potential Vcztc of cztc is set by the seq_v00 signal, the seq_v10 signal and the resistance values of the resistors R8, R9, R10 and R11. If the resistance values of the resistors R8, R9, R10 and R11 are r8, r9, r10 and r11, and if r8=300 k, r9=100 k, r10=100 k and r11=100 k, for example, the following is given.

1) When seq_v00="L", and seq_v10="H",
the cztc voltage Vcztc is 1.2 V (temperature: 27° C., Vf=0.6V).
2) When seq_v00="H", and seq_v10="L",
the cztc voltage Vcztc is 1.6V (temperature: 27° C., Vf=0.6V).
3) When seq_v00="L", and seq_v10="L",
the cztc voltage Vcztc is 2.0V (temperature: 27° C., Vf=0.6V).

The output of the operational amplifier OP4, to which cztc is input, and the output of the operational amplifier OP3, to which ptat is input, are connected via the resistors R12 and R13, and thereby the out voltage Vout can be set at a proper value. If the resistance values of the resistors R12 and R13, and if r12=100 k and r13=300 k, for example, the out voltage Vout is expressed by the following equation (3):

$$Vout = cztc*4 - ptat*3 \qquad \text{equation (3)}$$

Accordingly, the out voltage Vout is given, for example, by the following.

1) When seq_v00="L", and seq_v10="H",
the out voltage Vout is 0.75V (temperature: 27° C., Vf=0.6V).
2) When seq_v00="H", and seq_v10="L",
the out voltage Vout is 2.08V (temperature: 27° C., Vf=0.6V).
3) When seq_v00="L", and seq_v10="L",
the out voltage Vout is 3.5V (temperature: 27° C., Vf=0.6V).

When the control signal seq_vcg transitions to "H" level, the out signal is produced as VCG. The VCG is applied to the read word line WL of the memory cell array via the gate driver 27 and row decoder 23.

As is understood from the fact that the ptat has a positive temperature dependency of a value corresponding to the control signal and also from the equation (3), the output voltage VCG has a negative temperature dependency corresponding to the control signal. Thus, the temperature dependency of the output voltage VCG of the voltage conversion circuit CV1 is, for example, is expressed by the following.

1) When seq_v00="L", and seq_v10="H",
the temperature dependency of the VCG voltage is −1.5 mV/° C.,
2) When seq_v00="H", and seq_v10="L",
the temperature dependency of the VCG voltage is −2.4 mV/C, and
3) When seq_v00="L", and seq_v10="L",
the temperature dependency of the VCG voltage is −3.0 mV/° C.

1-9. The Relationship Between ptat Voltage Vptat and Temperatures

As has been described in the above 1-7. and 1-8., if the relationship between the ptat (Proportional to Absolute Temperature) voltage Vptat and the VCG voltage and the temperatures is summarized, the summarized result is as shown in FIG. 10.

As shown in FIG. 10, the temperature dependency of the output voltage VCG of the control gate voltage generating circuit 28 can be varied in accordance with the voltage level ("H"/"L") of the control signal seq_v00, seq_v10. Specifically, the temperature dependency of the read voltage of the memory cell can be varied in accordance with each of threshold voltages. Thus, as described above, the output voltage VCG of the voltage conversion circuit CV1 is, for example, is expressed by the following.

1) When seq_v00="L", and seq_v10="H" Vcg10 output state,
the temperature dependency of the VCG voltage is −1.5 mV/° C.,
2) When seq_v00="H", and seq_v10="L" Vcg00 output state,
the temperature dependency of the VCG voltage is −2.4 mV/° C., and
3) When seq_v00="L", and seq_v10="L" Vcg01 output state,
the temperature dependency of the VCG voltage is −3.0 mV/° C.

1-10. Threshold Value Distributions at Normal Temperatures and High Temperatures As a result of the above-described 1-9., the threshold value distributions at normal temperatures and high temperatures are as shown in FIG. 12. In FIG. 12, solid lines indicate a threshold value distribution at low temperatures (e.g. about −40° C.), and broken lines indicate a threshold value distribution at high temperatures (e.g. about 85° C.)

As described above, at high temperatures, the voltage control circuit 30 controls the control gate voltage generating circuit 28 so as to shift the read voltage toward lower levels in such a manner that the width of shift gradually increases as the threshold voltage for read-out from the memory cell transistor becomes higher.

Accordingly, as shown in FIG. 12, the read voltage Vcg can be shifted to lower levels (Vcg10 (low temperature)→Vcg10' (high temperature); Vcg00 (low temperature)→Vcg00'(high temperature); Vcg01 (low temperature)→Vcg01'(high temperature)) so as to increase the shift width (shift width: $\Delta V10 < \Delta V00 < \Delta V01$) as the threshold voltage for read-out from the memory cell transistor becomes higher ("10" state→"00" state→"01" state)<

2. Data Read Operation

Figure 11:
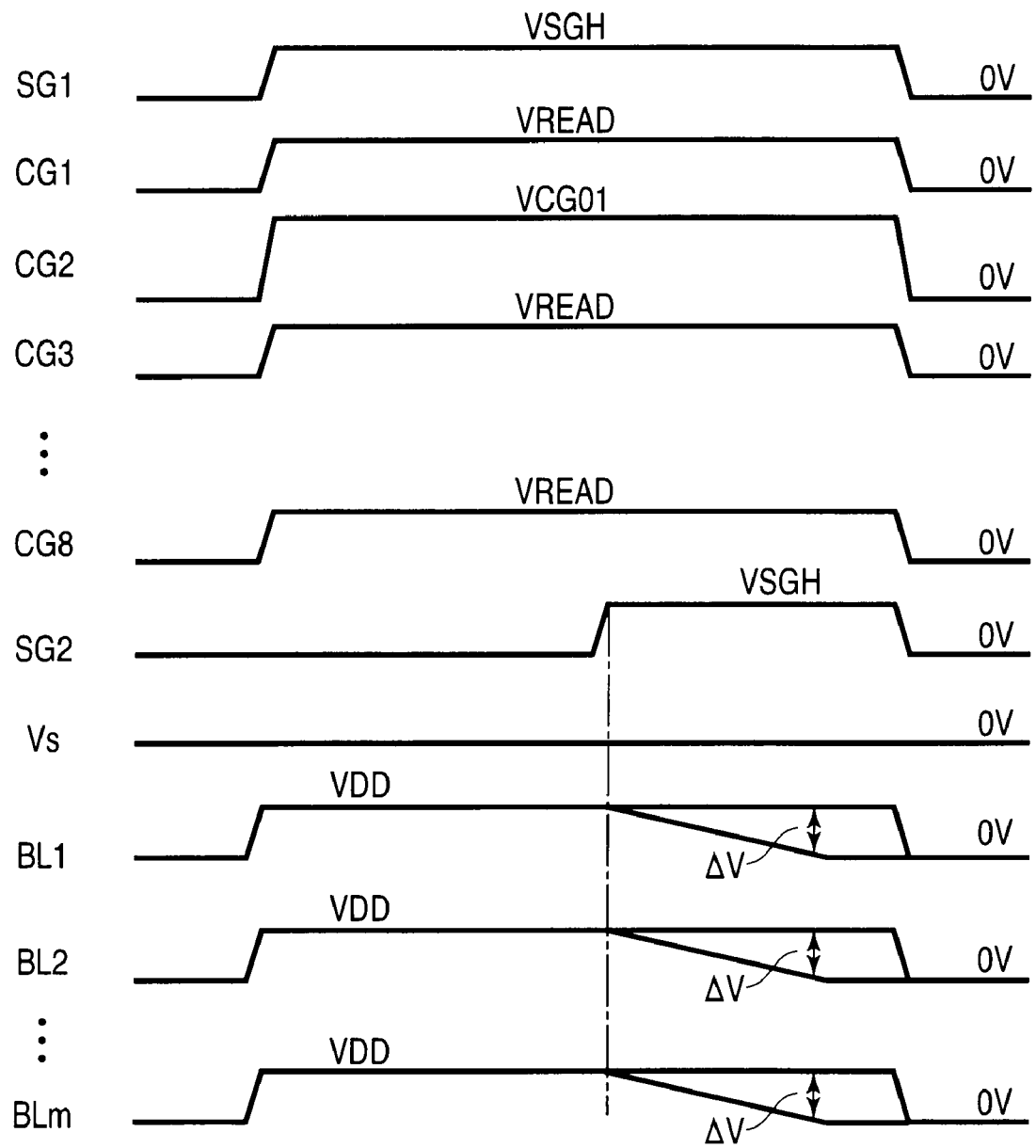
FIG. 11 is a waveform diagram at the time of a read operation of the semiconductor memory device according to the first embodiment.

Next, referring to FIG. 11, a description is given of the data read operation of the NAND flash memory having the structure according to the present embodiment. The case of reading out data of the cell, which is in the Vth01 write state that is the "01" state, is described by way of example.

To start with, the voltage of the select gate S1 is set at VSGH (e.g. about 4V) which is generated from the internal voltage generating circuit 29. In addition, the voltage of the control gate line, which is connected to the selected memory cell, is set at VCG01, the control gate voltages of the control gates connected to the other memory cells are set at a voltage Vread (e.g. 5V) which is output from the internal voltage generating circuit 29, and the source line SL is set at 0V.

The bit line BL is precharged to the power supply voltage VDD by the data control circuit 22, and then set in the floating state. In this state, the voltage of the select gate S2 is set at VSGH, and it is detected, on the basis of the variation of the bit line potential, whether a current flows from the selected memory cell transistor. Thus, data is read out.

Specifically, if the data written in the memory cell is "01" (the threshold voltage Vth of the memory cell transistor>Vcg01), the memory cell transistor is in the OFF state, and thus the bit line BL is kept in the precharge potential.

On the other hand, in the case where the data of the memory cell transistor is "11", "10" or "00", the memory cell transistor is in the ON state. Thus, the voltage of the bit line lowers from the precharge voltage by $\Delta V$. The data control circuit 22 detects this variation of the bit line potential, thereby reading out the Vth01 write data from the memory cell transistor.

Similarly, data is read out by setting the voltage of the control gate line, which is connected to the selected memory cell, at Vcg10, Vcg00. Further, the read data is subjected to a proper arithmetic operation in the data control circuit 22, and thereby the data control circuit 22 outputs to the data input/output buffer 26 the information indicative of which of the states, Vth11, Vth10, Vth00 and Vth01, the memory cell transistor is set in.

In the case of the present embodiment, as shown in FIG. 10, at high temperatures, the read voltages Vcg10, Vcg00 and Vcg01 can be shifted to lower levels (Vcg10 (low temperature)→Vcg10'(high temperature); Vcg00 (low temperature)→Vcg00'(high temperature); Vcg01 (low temperature)→Vcg01'(high temperature)) so as to increase the shift width (shift width: $\Delta V40 < \Delta V00 < \Delta V01$) as the threshold voltage becomes higher ("10" state "00" state "01" state).

Thus, even in the case where the temperature varies, the data of the memory cell transistor can correctly be read out, and the number of defective bits can be decreased.

3. Advantageous Effects of the Present Embodiment

According to the semiconductor memory device of the present embodiment, at least the following advantageous effects (1) to (3) can be obtained.

(1) Memory cell data can correctly be read out, without depending on temperatures, and the number of defective bits can be decreased.

For example, as shown in FIG. 1, the semiconductor memory device includes the voltage control circuit 30 which controls the read voltage Vcg in accordance with temperatures. In this control, for example, as shown in FIG. 10, at high temperatures, the read voltages Vcg10, Vcg00 and Vcg01 can be shifted to lower levels (Vcg10 (low temperature)→Vcg10' (high temperature); Vcg00 (low temperature)→Vcg00' (high temperature); Vcg01 (low temperature)→Vcg01'(high temperature)) so as to increase the shift width (shift width: $\Delta V10 < \Delta V00 < \Delta V0$) as the threshold voltage for read-out from the memory cell transistor becomes higher ("10" state "00" state "01" state).

Thus, even in the case where the temperature varies, the data of the memory cell transistor can correctly be read out, and the number of defective bits can be decreased.

As described above, according to the structure of the present embodiment, the temperature dependency of the read voltage can be made equal to the temperature dependency of the applied threshold voltage of the memory cell. Therefore, the variation of the read voltage due to the temperature variation can be canceled.

In the present embodiment, the read voltage Vcg in the memory cell data read operation has been described by way of example. The invention, however, is not limited to this example. The invention is similarly applicable to the write verify voltage of verify read at the time of the data write operation, and to the erase verify voltage of verify read at the time of the erase operation, and the same advantageous effects can be obtained.

(2) Microfabrication can advantageously be achieved.

If the degree of microfabrication of memory cells progresses, the variation in threshold voltage becomes greater, and the number of defective bits increases. In the structure of the present embodiment, however, the read voltage Vcg is controlled in accordance with temperatures. Therefore, the variation of the read voltage due to the temperature variation can be canceled.

Therefore, microfabrication can advantageously be achieved.

(3) A voltage margin of the read voltage can be secured, and multi-value memories can advantageously be implemented.

In the case where the amount of information per unit memory cell is to be increased by providing a greater number of threshold values in one memory cell transistor, the distance between neighboring threshold values becomes shorter. If the threshold values vary due to temperature variations, it becomes still more difficult to secure a sufficient voltage margin.

However, as described above, in the structure of the present embodiment, since the read voltage Vcg is controlled in accordance with temperatures, the variation of the read voltage due to temperature variations can be canceled.

Therefore, even in the case where the amount of information per unit memory cell is increased by providing a greater number of threshold values in one memory cell transistor and the distance between neighboring threshold values decreases, a voltage margin of the read voltage can be secured, and multi-value memories can advantageously be implemented.

Second Embodiment

An Example in which the Select Gate Voltage is Controlled in Accordance with Temperatures Next, a semiconductor memory device according to a second embodiment of the invention is described with reference to FIG. 13 to FIG. 16. This embodiment relates to an example in which the select gate voltage is also controlled in accordance with temperatures.

The memory cell transistor and the select transistor have different cell shapes, and thus have different temperature dependencies of their threshold values. If the temperature control of the memory cell transistor and the temperature control of the select transistor are equalized, the select gate voltage VSG would be varied by a degree more than necessary, relative to temperatures. Consequently, for example, the BLM potential is not correctly transferred to the channel. Besides, after the VDD is transferred to the channel, the channel may not transition into the floating state, and data may be written in the cell in which data is not to be written.

To cope with this problem, in the present embodiment, the temperature control of the select gate is set independently from the temperature control of the memory cell transistor. Thereby, the above-described problem is solved.

In the description below, a detailed description of the parts common to those in the first embodiment is omitted.

<Structure Example of Control Gate Voltage Generating Circuit>

Referring to FIG. 13, a structure example of the control gate voltage generating circuit according to the present embodiment is described. The control gate voltage generating circuit 28 according to this embodiment differs from that of the first embodiment in that bypass circuits BP5 and BP6 are further included, and a select gate (SG) voltage VSG is further output from the voltage conversion circuit CV2.

As shown in FIG. 13, the bypass circuits BP5 and BP6 short-circuit both ends of the resistors, thereby varying the resistance values between ztca, ztc and ptat and varying the temperature dependency of the ptat voltage Vptat.

The concrete circuit structure of the bypass circuit BP5, BP6 is the same as that of the bypass circuit BP1. A control signal seq_vsg from the voltage control circuit 30 is supplied to the bypass circuit BP5, BP6. The bypass circuit BP5 is connected to ztca and p2a and the bypass circuit BP6 is connected to ztc and p2b.

In the "L" state of the seq_vsg signal, the bypass circuits BP5 and BP6 do not short-circuit ztca and p2a, and ztc and p2b, respectively. In the "H" state of the seq_vsg signal, the bypass circuits BP5 and BP6 short-circuit ztca and p2a, and ztc and p2b, respectively.

Thereby, like the first embodiment, the temperature dependency of the ptat output voltage can be varied.

For example, if the resistance value r4 of the resistor elements R4A and R4B is r4=5 k, and the resistance value r5 of the resistor elements R5A and R5B is r5=20.2 k, the following is given by the above equations (1) and (2) in the "H" state of the seq_vsg signal:

the temperature dependency of ptat: 0.4 mV/° C.

ptat voltage: 1.32V (temperature: 27° C., Vf=0.6V).

<Structure Example of Voltage Conversion Circuit>

Next, a structure example of the voltage conversion circuit CV2 is described with reference to FIG. 14.

As shown in FIG. 14, on the basis of the ptat signal ztc signal, the voltage conversion circuit CV2 generates, as VCG, a voltage which is controlled by the seq_v00 signal and seq_v10 signal, and also generates, as VSG, a voltage which is controlled by the seq_vsg.

The voltage conversion circuit CV2 of the present embodiment differs from the voltage conversion circuit CV1 of the first embodiment in that the voltage conversion circuit CV2 further includes a NOR gate NOR2, inverters INV3 and INV4, a P-channel MOS transistor MP17, and an N-channel MOS transistor MN19.

The seq_v00 signal is supplied to one input terminal of the NOR gate NOR2, and the seq_vsg signal is supplied to the other input terminal of the NOR gate NOR2. The output of the NOR gate NOR2 is connected to an input terminal of the inverter INV3.

The output of the inverter INV3 is connected to the gate of the transistor MN16. The seq_vsg signal is supplied to the input terminal of the inverter INV4, and the output of the inverter INV4 is connected to the gate of the transistor MP17.

The seq_vsg signal is supplied to the gate of the transistor MN19.

In the "H" state of the seq_vsg signal, the transistor MN16 is turned on, and the node nb is short-circuited to the GND. Thereby, the voltage of cztc becomes 1.6V (temperature: 27° C., Vf=0.6V). At this time, the output voltage Vout from the operational amplifier OP4 becomes 2.44V from the above equation (3). In the "H" state of the seq_vsg signal, the transistors MP17 and MN19 are turned on, thus outputting the output signal as VSG.

<Relationship Between ptat Voltage Vptat and VSG Voltage, and Temperatures>

The relationship between the ptat voltage Vptat and VSG voltage, on the one hand, and the temperatures, on the other hand, is described with reference to FIG. 15. As shown in FIG. 15, in the present embodiment, the temperature dependency of the VSG output voltage can be controlled independently from the temperature dependency of the VCG voltage.

To be more specific, in accordance with the control of the voltage control circuit 30, the control gate voltage generating circuit 28 generates a select gate voltage VSG having a value which decreases in accordance with the rise in temperature. In other words, even in the case where the temperature varies, the select gate voltage VSG can be applied in a manner to cancel the temperature variation, and the BLM potential can be supplied to the channel.

In addition, after the VDD is transferred to the channel of the non-write cell, the select gates S1 and S2 can surely be turned off, and the channel can be set in the floating state. Thus, erroneous write of data in the non-write memory cell can be prevented.

<Example of Data Write Operation>

Next, an example of the data write operation of the present embodiment is described with reference to FIG. 16. FIG. 16 is a timing chart showing waveforms at the time of the write operation in this embodiment.

As shown in FIG. 16, to start with, 0V is applied to the selected bit line for data write, and the power supply voltage VDD is applied to the non-selected bit line in which data write is not executed.

The voltage VSG, which is generated from the internal voltage generating circuit 29, is applied to the select gate line SG1 which is connected to the select transistor S1 that connects the memory cell unit to the bit line. In addition, 0V is applied to the select gate line SG2 which is connected to the select transistor S2 that connects the memory cell unit to the source line SL.

The voltage VSG is required to transfer the internal power supply voltage VDD to the channel of the memory cell transistor. Thus, the voltage VSG is set at VSG=VDD+Vthsg, where Vthsg is the threshold value of the select transistor. In this case, 0V is supplied to the channel of the memory cell transistor for data write.

In the bit line in which no data is written, the select transistor S1 is turned off. Thus, if the threshold value of the select transistor is set at Vthsg, the Vdd (=VSG−Vthsg) is transferred to the channel of the memory cell transistor, and the channel is set in the floating state.

An internally boosted write voltage VPGM (~about 20V) is applied to the control gate line (e.g. CG2 in FIG. 16) which is connected to the selected memory cell transistor, and an intermediate potential VPASS (~about 10V) is applied to the control gate lines which are connected to the other non-selected memory cells.

As a result, since the potential of the channel of the write cell is 0V, a high voltage is applied between the floating electrode of the write cell and the substrate, and electrons are tunnel-injected in the floating electrode from the substrate, and the threshold voltage of the cell shifts in the positive direction.

On the other hand, since the channel of the non-selected cell in which data write is not executed is in the floating state, the channel is set at an intermediate potential due to capacitive coupling with the control electrode, and electrons are not injected.

Thus, the write operation is finished.

In the case where the threshold value of the write cell reaches the neighborhood of a threshold value at which data write is to be executed, it is effective to reduce the threshold distribution width of the memory cell by raising the write voltage of the bit line from 0V to the BLM (~1.0V) and delaying the write speed. In this case, the same operation as described above may be executed, except for the bit line potential.

As described above, the select gate voltage VSG needs to be supplied to the channel that is connected to the BLM potential. On the other hand, after the VDD is transferred to the channel of the non-write cell, it is necessary to turn off the select transistor SG1 and to set the channel in the floating state. Since the select transistor, like the memory cell, has the temperature dependency of the threshold voltage, it is desirable that the select gate voltage also have the temperature dependency.

In the meantime, when data write is executed, there is no need to apply the CG voltage for data read to the memory cell. Thus, like the present embodiment, when the write operation is executed, the select gate voltage VSG can be generated from the control gate voltage generating circuit 28.

As has been described above, according to the semiconductor memory device of this embodiment, the same advantageous effects as the above-described (1) to (3) can be obtained. Further, according to this embodiment, at least the following advantageous effect (4) can be obtained.

(4) At the time of the write operation, the select gate voltage VSG can be applied in a manner to cancel the threshold variation due to the temperature variation.

At the time of the write operation, in accordance with the control of the voltage control circuit 30, the control gate voltage generating circuit 28 of the present embodiment generates the select gate voltage VSG having a value which decreases in accordance with the rise in temperature. In other words, even in the case where the temperature varies, the select gate voltage VSG can be applied in a manner to cancel the threshold variation due to the temperature variation, and the BLM potential can be supplied to the channel.

In addition, after the VDD is transferred to the channel of the non-write cell, the select gate can surely be turned off, and the channel can be set in the floating state. Thus, erroneous write of data in the non-write memory cell can advantageously be prevented.

Comparative Example

Figure 17:
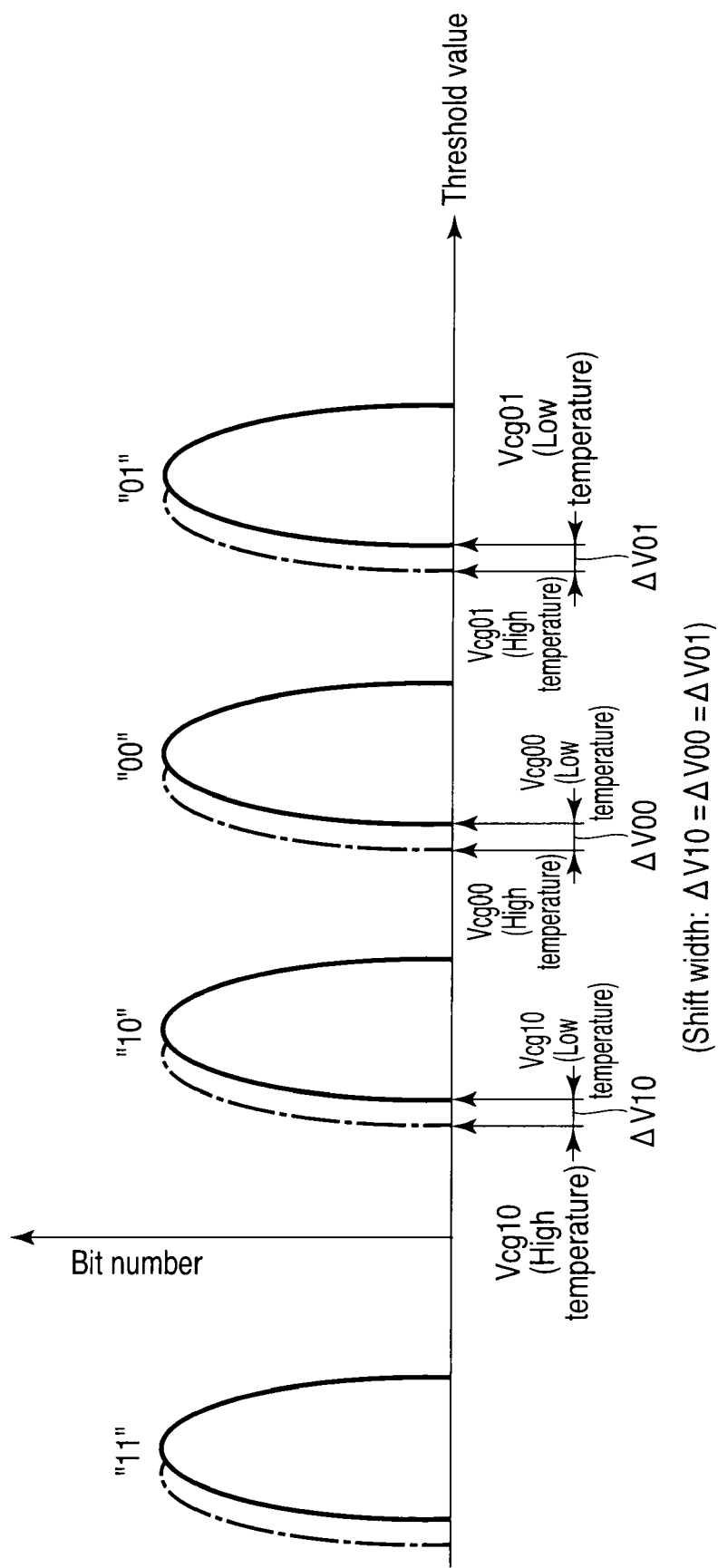
FIG. 17 shows a threshold distribution of a semiconductor memory device according to a comparative example of the present invention.
Figure 18:
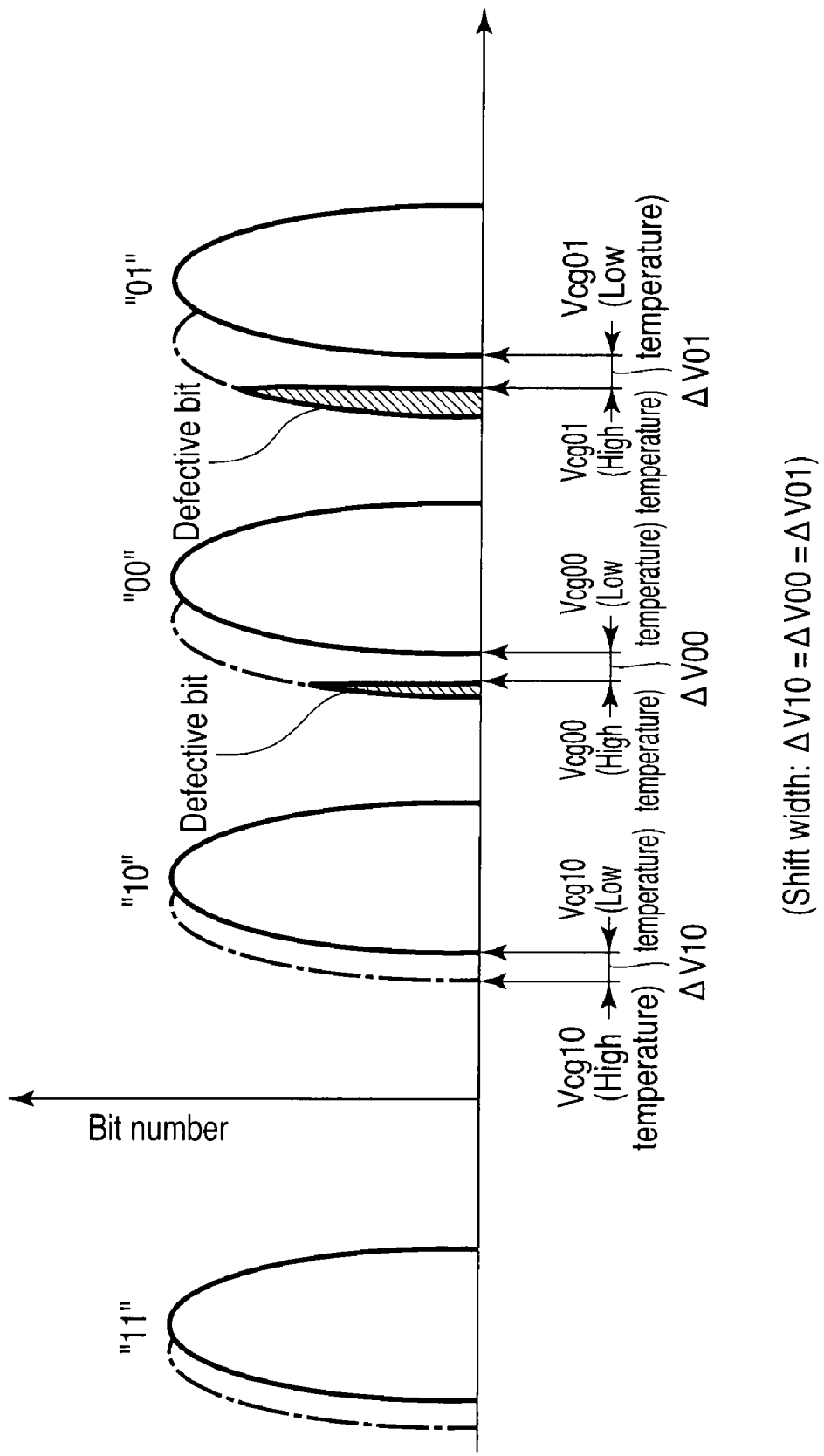
FIG. 18 is a view for explaining a threshold distribution of a semiconductor memory device according to a comparative example of the present invention, in a case where the degree of microfabrication is further progressed.

Next, referring to FIG. 17 and FIG. 18, a description is given of a semiconductor memory device according to a comparative example for comparison with the semiconductor memory devices of the first and second embodiments.

As shown in FIG. 17, in the semiconductor memory device according to this comparative example, in order to enable storage of multi-bit data in one memory cell transistor, four threshold voltages (Vth0, Vth1, Vth2, Vth3) are provided. Thereby, these data are stored in association with threshold voltages of "11", "10", "00" and "01".

At the time of data read of the memory cell transistor, write verify and erase verify ("read time"), a voltage that is applied to the gate of the memory cell is set at a voltage between two threshold voltages. For example, in the case where there are only cells which are in the states of Vth0 and Vth1, the gate voltage VCG is set at a value of Vth0<VCG<Vth1. In the case where data read is executed from the memory cell with the threshold voltage Vth0 in this state, the memory cell is set in the ON state and a drain current flows. On the other hand, when data read is executed from the memory cell with the threshold voltage Vth1, the memory cell is set in the OFF state, and no drain current flows. By detecting such a drain current, memory cell data can be read out.

If the temperature varies, like ordinary transistors, the threshold value of the memory cell transistor varies accordingly. On the other hand, since the gate voltage at the time of data read is, e.g. a power supply voltage or a voltage which is generated by dividing the power supply voltage, the voltage level does not vary even if there is a temperature variation. Thus, in order to correctly read out data even if there is a variation in threshold value due to the temperature variation, it is necessary to secure a sufficient potential difference (voltage margin) between the threshold voltages.

However, if the power supply voltage lowers or if four or more kinds of threshold voltages are provided in the memory cell in order to increase the amount of information per unit memory cell, a sufficiently large voltage margin cannot be secured.

Under the circumstances, as shown in FIG. 17, in order to secure a read voltage margin, it is considered effective to provide the voltage VCG, which is applied to the gate of the memory cell at the time of read, with the temperature dependency that is similar to the temperature dependency of the memory cell. In FIG. 17, solid lines indicate a threshold voltage distribution at low temperatures, and broken lines indicate a threshold voltage distribution at high temperatures.

In the meantime, if the degree of microfabrication of memory cells further progresses, memory cell data cannot be read out at high temperatures, and the number of defective bits increases. The reason for this is that the shift width of the read voltage is substantially constant at each threshold (shift width: $\Delta V10=\Delta V00=\Delta V01$).

FIG. 18 shows a threshold distribution in the case where the degree of microfabrication is increased. As shown in FIG. 18, even in the case where memory cell data in the "10" state with a low threshold value can correctly be read out, memory cell data in the "00" state or "01" state with a high threshold value, in particular, cannot correctly be read out at high temperatures. Thus, if the memory cell data in the "00" state or "01" state with a high threshold value is to be read out at high temperatures, the number of defective bits (hatched parts in FIG. 18) increases.

It is thought that this occurs due to the conspicuous effect of a parasitic transistor of the memory cell. If the degree of microfabrication progresses, the size of the memory cell becomes smaller, and the channel length at the end of the memory cell decreases. If the voltage of the control electrode is applied to the channel with the decreased length, a parasitic transistor, which causes leak current, occurs. It is considered that such a parasitic transistor becomes obvious with the progress of microfabrication of the process.

The parasitic transistor has such a feature that a more electric current is caused to flow as the voltage that is applied to the control electrode becomes higher. Hence, it becomes difficult to correctly read out memory cell data of, in particular, the memory cell in the "01" state with the highest threshold voltage, which greatly varies due to the temperature variation.

As has been described above, in the structure of the semiconductor memory device according to the comparative example, memory cell data cannot correctly be read out, depending on temperatures, and the number of defective bits increases.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which a plurality of memory cells are arranged in a matrix;
   a read unit which reads out data from the memory cells in the memory cell array;
   a write unit which writes data in the memory cells in the memory cell array;
   a read voltage generating unit which generates a read voltage and supplies the read voltage to the read unit; and
   a voltage control unit which controls the read voltage in accordance with temperatures
   wherein the read voltage generating unit generates, in accordance with control of the voltage control unit, the read voltage which shifts to a lower level, at high temperatures, in a manner to increase a shift width as a threshold voltage for read-out from the memory cell becomes higher.

2. The device according to claim 1, wherein the memory cell is a memory cell which is capable of storing multi-bit data.

3. The device according to claim 1, wherein the read voltage generating unit includes:
   a voltage division circuit which generates a resistor-divided voltage in accordance with a control signal from the voltage control unit; and
   a voltage conversion circuit which converts an output of the voltage division circuit and generates the read voltage.

4. The device according to claim 3, wherein the voltage division circuit includes:
   first and second resistor circuits each including a plurality of resistor elements which are connected in series at one end and the other end between first and second reference power supplies; and
   first and second bypass circuits each including a plurality of bypass circuits which have current paths connected at one end and the other end to the one end and other end of the plurality of resistor elements of the first and second resistor circuits, and which vary resistance values by short-circuiting both ends of the plurality of resistors in accordance with the control signal.

5. The device according to claim 4, wherein the voltage division circuit further includes:
   a switching element having a current path with one end and the other end connected between the first reference power supply and one end of each of the first and second resistor circuits; and
   an operational amplifier having an input connected to the other ends of the first and second resistor circuits, and having an output connected to a control terminal of the switching element.

6. The device according to claim 5, wherein the voltage division circuit further includes a diode having an anode connected to a non-inversion input of the operational amplifier, and having a cathode connected to the second reference power supply.

7. The device according to claim 5, wherein the voltage division circuit further includes:
   a resistor element having one end connected to the other end of the second resistor circuit; and
   diodes having anodes connected to the other end of the resistor element, and cathodes connected to the second reference power supply.

8. The device according to claim 4, wherein each of the first and second bypass circuits includes:
- an inverter having an input to which a control signal from the voltage control circuit is input;
- a first transistor of a first conductivity type having a control terminal to which an output of the inverter is connected; and
- a second transistor of a second conductivity type having a control terminal to which the control signal from the voltage control circuit is input, and having a current path with one end and the other end connected to one end and the other end of a current path of the first transistor.

9. A semiconductor memory device comprising:
- a memory cell array including a memory cell unit in which current paths of a plurality of memory cells are connected in series along a first direction, and select transistors which have gate electrodes commonly connected along a second direction by a select gate line and which select the memory cell unit;
- a read unit which reads out data from the memory cells in the memory cell array;
- a write unit which writes data in the memory cells in the memory cell array;
- a voltage control unit which controls a select gate voltage in accordance with temperatures; and
- a select gate voltage generating unit which generates, in accordance with control of the voltage control unit at a time of data write, the select gate voltage having a value which decreases in accordance with an increase in temperature, and supplies the select gate voltage to the read unit.

10. The device according to claim 9, wherein the memory cell is a memory cell which is capable of storing multi-bit data.

11. The device according to claim 10, wherein the select gate voltage generating unit generates, in accordance with control of the voltage control unit, the select gate voltage which shifts to a lower level, at high temperatures, in a manner to increase a shift width as a threshold voltage for read-out from the memory cell becomes higher.

12. The device according to claim 9, wherein the select gate voltage generating unit includes:
- a voltage division circuit which generates a resistor-divided voltage in accordance with a control signal from the voltage control unit; and
- a voltage conversion circuit which converts an output of the voltage division circuit and generates the read voltage.

13. The device according to claim 12, wherein the voltage division circuit includes:
- first and second resistor circuits each including a plurality of resistor elements which are connected in series at one end and the other end between first and second reference power supplies; and
- first and second bypass circuits each including a plurality of bypass circuits which have current paths connected at one end and the other end to the one end and other end of the plurality of resistor elements of the first and second resistor circuits, and which vary resistance values by short-circuiting both ends of the plurality of resistors in accordance with the control signal.

14. The device according to claim 13, wherein the voltage division circuit further includes:
- a switching element having a current path with one end and the other end connected between the first reference power supply and one end of each of the first and second resistor circuits; and
- an operational amplifier having an input connected to the other ends of the first and second resistor circuits, and having an output connected to a control terminal of the switching element.

15. The device according to claim 14, wherein the voltage division circuit further includes a diode having an anode connected to a non-inversion input of the operational amplifier, and having a cathode connected to the second reference power supply.

16. The device according to claim 13, wherein the voltage division circuit further includes:
- a resistor element having one end connected to the other end of the second resistor circuit; and
- diodes having anodes connected to the other end of the resistor element, and cathodes connected to the second reference power supply.

17. The device according to claim 13, wherein each of the first and second bypass circuits includes:
- an inverter having an input to which a control signal from the voltage control circuit is input;
- a first transistor of a first conductivity type having a control terminal to which an output of the inverter is connected; and
- a second transistor of a second conductivity type having a control terminal to which the control signal from the voltage control circuit is input, and having a current path with one end and the other end connected to one end and the other end of a current path of the first transistor.

* * * * *